US009601713B2

(12) United States Patent
Fukagawa

(10) Patent No.: US 9,601,713 B2
(45) Date of Patent: Mar. 21, 2017

(54) ELECTRO-OPTIC DEVICE, METHOD OF MANUFACTURING ELECTRO-OPTIC DEVICE, AND ELECTRONIC APPARATUS

(71) Applicant: SEIKO EPSON CORPORATION, Tokyo (JP)

(72) Inventor: Takefumi Fukagawa, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/276,732

(22) Filed: May 13, 2014

(65) Prior Publication Data

US 2014/0339523 A1 Nov. 20, 2014

(30) Foreign Application Priority Data

May 14, 2013 (JP) ................. 2013-101931

(51) Int. Cl.
| | | |
|---|---|---|
| H01L 51/00 | (2006.01) | |
| H01L 33/00 | (2010.01) | |
| H01L 21/00 | (2006.01) | |
| H01J 1/62 | (2006.01) | |
| H01J 63/04 | (2006.01) | |
| H01L 51/52 | (2006.01) | |

(52) U.S. Cl.
CPC ........ *H01L 51/5246* (2013.01); *H01L 51/524* (2013.01); *H01L 51/5237* (2013.01); *H01L 51/5253* (2013.01); *H01L 2251/558* (2013.01)

(58) Field of Classification Search
CPC ............. H01L 51/5246; H01L 51/5237; H01L 51/524; H01L 51/5253; H01L 51/5256
USPC .. 257/81, 100, 40, 99, E33.059; 438/28, 26; 313/512
See application file for complete search history.

(56) References Cited

U.S. PATENT DOCUMENTS

| | | | |
|---|---|---|---|
| 2003/0164674 A1 | 9/2003 | Imamura | |
| 2005/0110020 A1* | 5/2005 | Hayashi et al. | ................ 257/72 |
| 2007/0114519 A1* | 5/2007 | Hayashi | ............. H01L 51/5253 257/40 |
| 2007/0132381 A1* | 6/2007 | Hayashi | ............. H01L 51/5253 313/512 |
| 2009/0153042 A1 | 6/2009 | Izumi et al. | |

(Continued)

FOREIGN PATENT DOCUMENTS

| | | |
|---|---|---|
| JP | A-2005-251721 | 9/2005 |
| JP | 2006-351307 A | 12/2006 |

(Continued)

*Primary Examiner* — Fernando L Toledo
*Assistant Examiner* — Aaron Gray
(74) *Attorney, Agent, or Firm* — Oliff PLC

(57) ABSTRACT

An electro-optic device includes: a first substrate that includes a first surface; an optical element that is disposed in a first region on the first surface; a casing that is disposed to overlap with a part of the optical element along an outer periphery of the first region on the first surface and includes first and second end portions; a first resin layer that is disposed on an inside of the second end portion of the casing on the first surface and is installed to overlap with at least a part of the optical element; a second resin layer that is disposed on the first resin layer; and a second substrate that faces the first surface and is disposed on the second resin layer.

20 Claims, 14 Drawing Sheets

(56) References Cited

U.S. PATENT DOCUMENTS

2010/0019654 A1* 1/2010 Hayashi ............ H01L 51/5237
  313/498
2010/0295759 A1* 11/2010 Tanaka ............... H01L 51/5237
  345/76

FOREIGN PATENT DOCUMENTS

| JP | A-2007-157606 | 6/2007 |
| JP | A-2008-59868 | 3/2008 |
| JP | A-2009-164107 | 7/2009 |
| JP | A-2011-146323 | 7/2011 |
| JP | A-2012-38574 | 2/2012 |
| WO | WO 03/061346 A1 | 7/2003 |

* cited by examiner

ELECTRO-OPTIC DEVICE, METHOD OF MANUFACTURING ELECTRO-OPTIC DEVICE, AND ELECTRONIC APPARATUS

BACKGROUND

1. Technical Field

The present invention relates to an electro-optic device, a method of manufacturing the electro-optic device, and an electronic apparatus.

2. Related Art

Electro-optic devices are known in which an element substrate in which optical elements such as light-emitting elements or light-receiving elements are disposed and a counter substrate facing to the surface of the element substrate on which the optical elements are disposed are bonded (for example, see JP-A-2008-59868). In the electro-optic device (organic EL device) disclosed in JP-A-2008-59868, an element substrate and a counter substrate (sealing substrate) are bonded via a sealing member disposed on the outside of a region in which light-emitting elements are disposed. The inside surrounded by the sealing member is filled with a resin material (filling layer) to alleviate stress, impact, or the like applied from the outside. Thus, it is possible to prevent the counter substrate from being deformed when the inside of the sealing member is hollow (air layer) or prevent light from being reflected from an interface between the counter substrate and the air layer.

In the electro-optic device disclosed in JP-A-2008-59868, however, since the sealing member is disposed on the outside of the region in which the light-emitting elements are disposed, there is a problem that a region (so-called frame region) on the outside of the region (light emission region) in which the light-emitting elements are disposed increases in size in the entire region on the element substrate. Also, there is a problem that the resin material filling the inside of the sealing member protrudes to the outside of the sealing member when one substrate is pressed against the other substrate, or curving or distortion occurs in the element substrate or the counter substrate since the thickness of the sealing member and the thickness of the resin material become non-uniform due to contraction (volume variation) when the resin material is hardened.

On the other hand, an electro-optic device in which an element substrate and a counter substrate are bonded without a sealing member has been suggested (for example, see JP-A-2007-157606). In the electro-optic device (light-emitting device) disclosed in JP-A-2007-157606, the element substrate and the counter substrate (surface protection substrate) are bonded by applying a resin material (adhesive layer) to light-emitting elements by a screen printing method or a slit coating method. The resin material (adhesive layer) has a function of adhering and fixing the counter substrate to the light-emitting elements and a function of alleviating external stress or impact. When such a configuration is realized, a frame region can be decreased in size compared to the configuration in which the sealing member is provided as in the electro-optic device disclosed in JP-A-2008-59868. Thus, it is possible to prevent the curving or distortion of the counter substrate due to the non-uniformity of the thickness of the sealing member and the thickness of the resin material.

Incidentally, in the configuration of the electro-optic device disclosed in JP-A-2007-157606, the resin material adhering and fixing the counter substrate to the light-emitting elements is considered to be preferably a low-viscosity material having good fluidity to form a surface coming into contact with the counter substrate as a flat surface as much as possible by alleviating unevenness on the light-emitting elements caused due to partition walls or the like. However, when the resin material has low viscosity, wet-spreading occurs up to a range more than necessary before the applied resin material is hardened, and thus for example, there is a problem that a defect such as overlapping of the resin material with a terminal section may occur.

Conceivable solutions to the above-mentioned problem include, for example, a method of applying and hardening a resin material covering the light-emitting elements to form a first resin layer and subsequently applying a resin layer between the first resin layer and the counter substrate to adhere both of the first resin layer and the counter substrate with a second resin layer so that the volume of the resin material applied once is decreased and the degree of wet-spreading is suppressed to be small. However, since the low-viscosity resin material is used in the first resin layer covering at least the light-emitting elements, there is a problem that it is difficult to remove the wet-spreading of the resin material when the first resin layer is formed. Also, since a difference occurs in the degree of the wet-spreading of the resin material depending on an elapsed time after the application of the resin material, there is also a problem that a variation occurs between individual devices.

In particular, when a process is performed on a large-scale mother substrate (element substrate) from which a plurality of electro-optic devices can be obtained, the elapsed time until hardening is different between the initially disposed resin material and the subsequently disposed resin material at the time of formation of the first resin layer on the mother substrate. Therefore, there is a concern that a variation occurs in the wet-spreading, and thus a shape may be different between the formed first resin layers. Then, there is a problem that pressure applied between the substrates may not be uniform, bubbles may be generated between the first resin layer and the second resin layer, or a variation may occur in the wet-spreading of the second resin layer when the mother substrate is adhered to the counter substrate by the second resin layer.

SUMMARY

An advantage of some aspects of the invention is to provide an electro-optic device capable of limiting a frame region to be smaller and preventing wet-spreading of a resin material more than necessary or a variation in the wet-spreading and a method of manufacturing the electro-optic device.

The invention can be realized in the following forms or application examples.

Application Example 1

According to this application example, there is provided an electro-optic device including: a first substrate that includes a first surface; an optical element that is disposed in a first region on the first surface; a casing that is disposed to overlap with a part of the optical element along an outer periphery of the first region on the first surface and includes first end portion and a second end portion located between the first end portion and an end portion of the first substrate; a first resin layer that is disposed on an inside of the second end portion of the casing on the first surface and is installed to overlap with at least a part of the optical element; a second resin layer that is disposed on the first resin layer; and a second substrate that faces the first surface and is disposed on the second resin layer.

In the configuration of this application example, the casing is installed to overlap with the part of the optical element along the outer periphery of the first region in which the optical element is disposed, and the first resin layer is disposed to overlap with at least the part of the optical element on the inside of the second end portion of the casing. That is, the casing is disposed to surround the periphery of the first resin layer formed on the optical element. Therefore, when the first resin layer is formed on the optical element, the excessive wet-spreading of the material of the first resin layer to be disposed is suppressed by the casing, and thus a second region (so-called frame region) in the first surface can be set to be small. For example, when a process is performed on a large-scale mother substrate from which the plurality of electro-optic devices can be obtained, a variation in the wet-spreading of the material of the first resin layer in the same mother substrate is suppressed by the casing. Thus, it is possible to provide the electro-optic device in which the second region (frame region) is limited to be small and the variation is small.

Application Example 2

In the electro-optic device according to the application example, a film thickness of the first resin layer may become gradually thicker with further separation from the casing. A thickness of a thickest portion in the film thickness of the first resin layer may be thicker than a thickness of a thickest portion in a film thickness of the casing.

In the configuration of this application example, the film thickness of the first resin layer becomes thicker with further separation from the casing and the first resin layer is formed in the convex shape. Therefore, when the first and second substrates are bonded, a void rarely occurs between the first resin layer and the second resin layer. Also, the first resin layer has the film thickness thicker than the casing. Therefore, even when the second resin layer is disposed to be astride the first resin layer and the casing, the air between the first resin layer and the second resin layer easily moves outside. Thus, it is possible to prevent bubbles from being generated between the first resin layer and the second resin layer more reliably.

Application Example 3

In the electro-optic device according to the application example, the second end portion of the casing may be disposed in a second region surrounding the first region. The first resin layer may be disposed to embed an inside of the first end portion of the casing and come into contact with the casing up to a closer side of the second end portion than the first end portion.

In the configuration of this application example, the second end portion which is the end portion of the outside of the casing is disposed in the second region on the outside of the first region in which the optical element is disposed, and the first resin layer is disposed to embed the inside of the casing and come into contact with the casing up to the further outside than the first end portion, which is the end portion of the inside of the casing. Therefore, the first region in which the optical element is disposed is covered with the casing and the first resin layer, while the wet-spreading of the material of the first resin layer is suppressed by the casing and the frame region is caused to be small, and thus stress or impact on the optical element can be alleviated.

Application Example 4

In the electro-optic device according to the application example, the first end portion of the casing may be disposed in the first region. A thickest portion in a film thickness of the casing may be disposed in the second region.

In the configuration of this application example, since the inner end portion of the casing is disposed in the first region, the casing can be disposed to be near the inside of the end portion of the first substrate, compared to the case in which the inner end portion is disposed in the second region. Also, since the thickest portion in the film thickness of the casing that can stop the wet-spreading of the material at the time of the formation of the first resin layer is disposed in the second region, the first resin layer can be disposed up to the outside of the first region. Thus, the region in which the optical element is disposed can be covered with the first resin layer while the frame region on the outside of the first region is caused to be smaller, and thus stress or impact on the optical element can be alleviated more reliably.

Application Example 5

In the electro-optic device according to the application example, a ratio of a thickness of a thickest portion in a film thickness of the first resin layer to a thickness of a thickest portion in a film thickness of the casing may be equal to or greater than 2:1 and may be equal to or less than 5:1.

In the configuration of this application example, by setting the ratio of the thickness of the first resin layer to the thickness of the casing to be in the foregoing range, the wet-spreading of the material can be stopped at the thickest portion of the casing, while the surface of the first resin layer swells toward the second resin layer on the upper side of the thickest portion of the casing, at the time of the formation of the first resin layer. Thus, it is possible to more reliably prevent bubbles from being generated between the first resin layer and the second resin layer due to occurrence of a hollow on the surface of the first resin layer, and it is possible to prevent the first resin layer from being formed up to the outside beyond the casing, while disposing the first resin layer within the range covering the optical element.

Application Example 6

In the electro-optic device according to the application example, an outer peripheral end portion of the second resin layer may be disposed between an outer peripheral end portion of the first resin layer and the second end portion of the casing.

In the configuration of this application example, the second resin layer is disposed up to the outside of the first resin layer and on the inside of the casing. Therefore, when the second resin layer is formed, it is possible to prevent the wet-spreading of the material of the second resin layer, while covering the optical element with the material of the second resin layer. Thus, it is possible to limit the frame region to be small and to efficiently alleviate stress or impact on the optical element.

Application Example 7

In the electro-optic device according to the application example, a ratio of a thickness of a thinnest portion in a film thickness of the second resin layer to a thickness of a thickest portion in a film thickness of the first resin layer may be equal to or greater than 1:9 and may be equal to or less than 3:7.

In the configuration of this application example, by setting the ratio of the thickness of the second resin layer to the thickness of the first resin layer to be in the foregoing range, the wet-spreading of the material of the second resin layer can be stopped within the range not exceeding the casing, while disposing the material of the second resin layer within the range reaching up to the casing, at the time of the formation of the second resin layer. Thus, it is possible to prevent the second resin layer from being formed up to the outside beyond the casing, while disposing the second resin layer within the range covering the optical element.

Application Example 8

In the electro-optic device according to the application example, a difference between a refractive index of the casing and a refractive index of the first resin layer may be equal to or less than 0.05.

In the configuration of this application example, since the light reflection from the interface between the casing and the first resin layer is suppressed, a reduction in the light transmission amount due to the light reflection from the first region in which the optical element is disposed can be suppressed to be small.

Application Example 9

In the electro-optic device according to the application example, a difference between a refractive index of the casing and a refractive index of the second resin layer and a difference between a refractive index of the first resin layer and the refractive index of the second resin layer may be equal to or less than 0.05.

In the configuration of this application example, since the light reflection from the interface between the casing and the second resin layer and the light reflection from the interface between the first resin layer and the second resin layer are suppressed, a reduction in the light transmission amount due to the light reflection from the first region in which the optical element is disposed can be suppressed to be smaller.

Application Example 10

In the electro-optic device according to the application example, the optical element may include an organic light-emitting layer and a sealing layer covering the organic light-emitting layer.

In the configuration of this application example, in an organic EL device including the light-emitting element including the organic light-emitting layer as optical elements, the stress or impact on the optical element can be alleviated, while narrowing the frame region other than the first region which is a light-emitting region.

Application Example 11

According to this application example, there is provided an electronic apparatus including the electro-optic device described in the foregoing application examples.

In the configuration of this application example, it is possible to provide the electronic apparatus including the electro-optic device in which the frame region is limited to be small and a variation is small.

Application Example 12

According to this application example, there is provided a method of manufacturing an electro-optic device. The method includes: disposing an optical element in a first region on a first surface of a first substrate; disposing a first material in a casing shape to overlap with a part of the optical element along an outer periphery of the first region on the first surface and have a first end portion and a second end portion located between the first end portion and an end portion of the first substrate; disposing a second material different from the first material to overlap with at least a part of the optical element on an inside of the second end portion of the first material on the first surface; forming a casing and a first resin layer by hardening the first and second materials; disposing a third material on the first resin layer; disposing a second substrate on the third material; and adhering the first resin layer and the second substrate by the third material by hardening the third material.

In the manufacturing method of this application example, the first material is disposed in the casing shape along the outer periphery of the first region in which the optical element is disposed, and the second material is disposed on the inside of the second end portion of the first material. Therefore, since the wet-spreading of the second material is suppressed by the first material disposed in the casing shape, the second region in the first surface can be caused to be small. For example, when the process is performed on the large-scale mother substrate from which the plurality of electro-optic devices can be obtained, an excessive variation in the wet-spreading of the second material in the same mother substrate is suppressed by the first material disposed in the casing shape. Further, by hardening the first and second materials together, it is possible to improve the affinity between the two materials. Thus, it is possible to manufacture the electro-optic device in which the second region (frame region) is limited to be small and the variation is small.

Application Example 13

In the manufacturing method according to the application example, a viscosity of the first material may be equal to or greater than 10,000 cps and may be equal to or less than 100,000 cps and a viscosity of the second material may be equal to or greater than 10 cps and may be equal to or less than 1,000 cps.

In the manufacturing method of this application example, by using a material with high viscosity as the first material forming the casing, the wet-spreading of the first material is suppressed. Therefore, the distance between the first end portion and the second end portion of the casing can be suppressed to be short, and the wet-spreading of the second material can be suppressed by forming the cross-sectional shape of the casing as a convex shape. On the other hand, using a material with low viscosity as the second material, the second material is satisfactorily wet and spread. Therefore, since the optical element can be covered with the second material, it is possible to smooth the surface of the second material and thus prevent bubbles from being generated.

Application Example 14

In the manufacturing method according to the application example, a viscosity of the third material may be equal to or greater than 10 cps and may be equal to or less than 1,000 cps.

In the manufacturing method of this application example, by using a material with low viscosity as the third material, the third material is satisfactorily wet and spread. Therefore, since the optical element can be covered with the third material, it is possible to prevent bubbles from being generated between the third material and the second material.

Application Example 15

In the manufacturing method according to the application example, an epoxy resin may be used as the first, second, and third materials.

In the manufacturing method of this application example, since an epoxy resin which contracts less at the time of the hardening than other resins such as an acrylic resin is used, it is possible to prevent curving, distortion, or the like of the substrates caused due to the contraction at the time of the hardening of the first material, the second material, and the third material. Also, by using the same material as the first material, the second material, and the third material, the differences between the related refractive indexes can be caused to be small.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments implementing the invention will be described with reference to the drawings. The used drawings are appropriately expanded or contracted to be displayed so that portions to be described can be recognized. Also, constituent elements other than constituent elements necessary for description are not illustrated in some cases.

In the following embodiments, for example, the description "on a substrate" is assumed to include a case in which elements are disposed on a substrate to come into contact therewith, a case in which elements are disposed via other elements on a substrate, and a case in which some of the elements are disposed on a substrate to come into contact therewith and some of the elements are disposed via other elements.

First Embodiment

Organic EL Device

Figure 1:
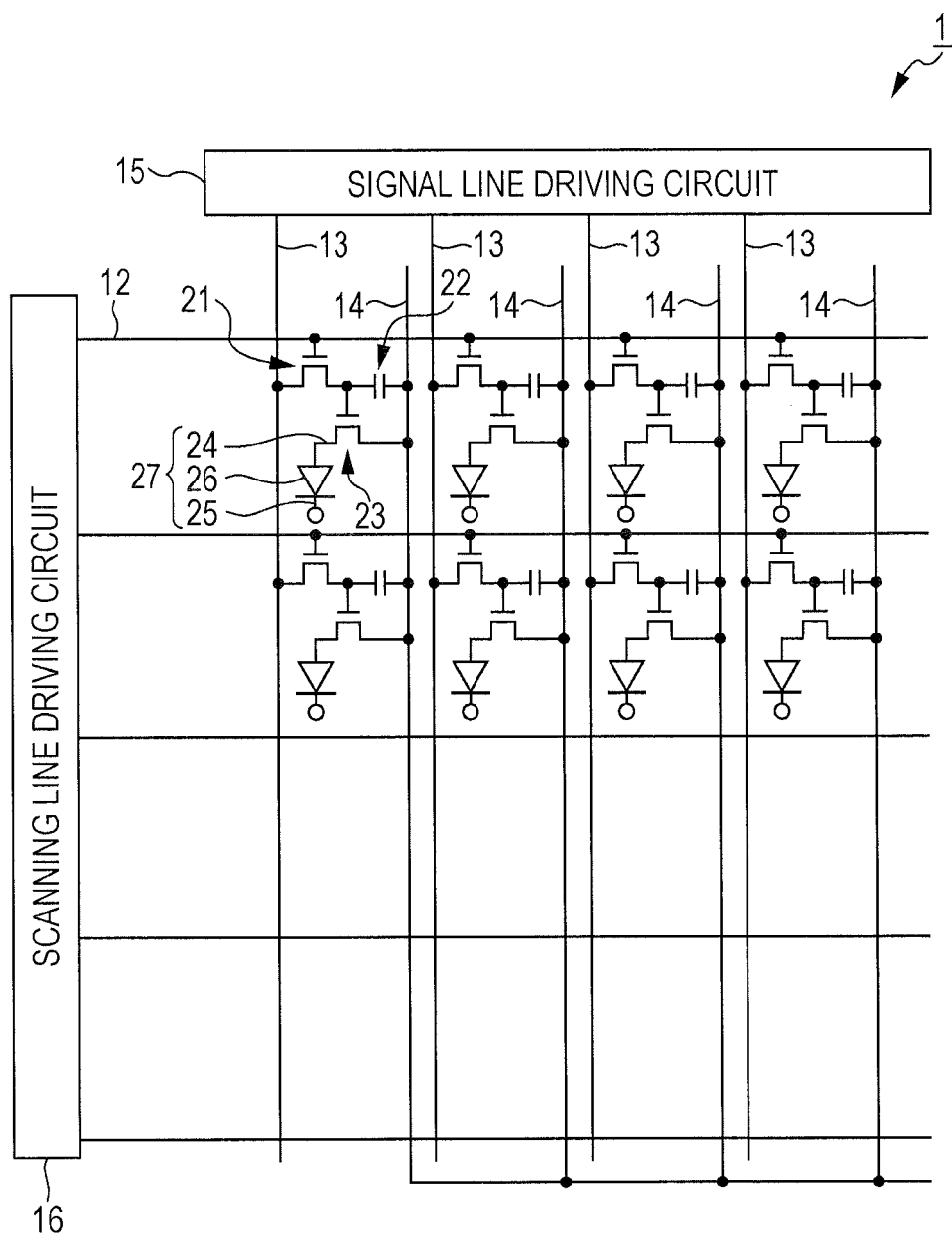
FIG. 1 is an equivalent circuit diagram illustrating an electric configuration of an organic EL device according to a first embodiment.
Figure 2:
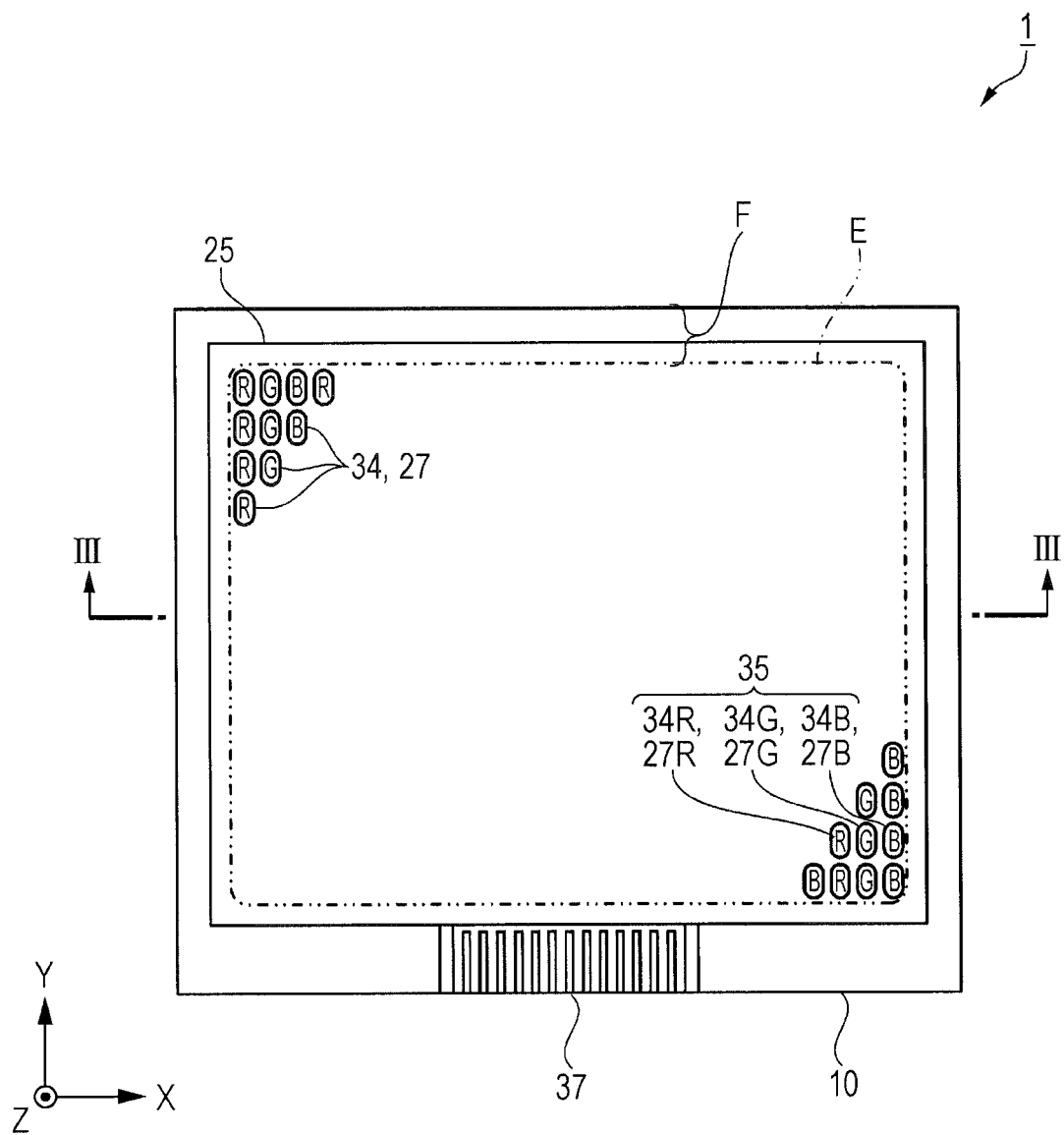
FIG. 2 is a schematic plan view illustrating the configuration of the organic EL device according to the first embodiment.

First, the configuration of an organic EL device which is an electro-optic device according to a first embodiment will be described with reference to the drawings. FIG. 1 is an equivalent circuit diagram illustrating an electric configuration of the organic EL device according to the first embodiment. FIG. 2 is a schematic plan view illustrating the configuration of the organic EL device according to the first embodiment. In FIG. 2, a counter substrate 48 (see FIG. 3) is not illustrated.

As illustrated in FIG. 1, an organic EL device 1 is an active matrix type organic EL device in which transistors are used as switching elements. The transistor is, for example, a thin film transistor (hereinafter referred to as a TFT) using a thin film semiconductor layer.

The organic EL device 1 includes an element substrate 10 (see FIG. 2) which is a first substrate, scanning lines 12 that are installed on a first surface 10a (see FIG. 3) of the element substrate 10, signal lines 13 that extend in a direction intersecting the scanning lines 12, and power lines 14 that extend in parallel to the signal lines 13. A signal line driving circuit 15 that includes a shift register, a level shifter, a video line, and an analog switch is connected to the signal lines 13. A scanning line driving circuit 16 that includes a shift register and a level shifter is connected to the scanning lines 12.

A region of sub-pixels 34 (see FIG. 2) is partitioned by the scanning lines 12 and the signal lines 13. The sub-pixels 34 are minimum display units of the organic EL device 1 and are, for example, arranged in a matrix form in the extension direction of the scanning lines 12 and the extension direction of the signal lines 13. A switching transistor 21, a driving transistor 23, a holding capacitor 22, an anode 24, a cathode 25, and a light-emitting functional layer 26 including an organic light-emitting layer are installed in each sub-pixel 34.

A light-emitting element 27 which is an example of an optical element is formed by the anode 24, the cathode 25, and the light-emitting functional layer 26 including the organic light-emitting layer. In the light-emitting element 27, luminescence is obtained by recombining holes injected from the side of the anode 24 and electrons injected from the side of the cathode 25 in the light-emitting layer of the light-emitting functional layer 26.

In the organic EL device 1, when the scanning lines 12 are driven and the switching transistors 21 are turned on, image signals supplied via the signal lines 13 are held in the holding capacitors 22 and the sources and the drains of the driving transistors 23 enter a conduction state according to the state of the holding capacitors 22. Then, when electric connection to the power lines 14 via the driving transistors 23 is made, a current flows from the power lines 14 to the anodes 24 and a current further flows to the cathodes 25 via the light-emitting functional layers 26.

The current has a level according to the conduction state between the source and the drain of the driving transistor 23. At this time, the conduction state between the source and the drain of the driving transistor 23, that is, the conduction state of a channel of the driving transistor 23, is controlled by the potential of a gate of the driving transistor 23. Then, the light-emitting layer of the light-emitting functional layer 26 emits light with luminance according to an amount of current flowing between the anode 24 and the cathode 25.

In other words, when the light-emitting state of the light-emitting element 27 is controlled by the driving transistor 23, one of the source and the drain of the driving transistor 23 is electrically connected to the power line 14 and the other of the source and the drain of the driving transistor 23 is electrically connected to the light-emitting element 27.

As illustrated in FIG. 2, the organic EL device 1 includes a light-emitting region E which is a first region with a substantially rectangular planar shape and a frame region F which is a second region surrounding the circumference of the light-emitting region E on the element substrate 10. The light-emitting region E is a region that practically contributes to luminescence in the organic EL device 1. The frame region F is a region that does not practically contribute to the luminescence in the organic EL device 1. The organic EL device 1 may include a dummy region in which the light-emitting elements 27 are disposed in the frame region F.

Since the outer appearance of an electronic apparatus such as a portable apparatus is miniaturized, a display unit is required to be as large (broad) as possible with respect to the outer appearance of the electronic apparatus. Accordingly, when the organic EL device 1 is used in a display unit of a small electronic apparatus such as a portable apparatus, it is preferable that the light-emitting region E be very large (broad) and the frame region F be very small (narrow) with respect to the outer appearance of the element substrate 10.

In the light-emitting region E, the sub-pixels 34 (light-emitting elements 27) are arrayed in, for example, a matrix form. The sub-pixel 34 has, for example, a substantially rectangular planar shape. The four vertexes of the rectangular shape of the sub-pixel 34 may be rounded. In this case, the planar shape of the sub-pixel 34 may be configured to have four sides and curved portions corresponding to the four corners.

The organic EL device 1 according to the embodiment includes a sub-pixel 34R that emits red (R) light, a sub-pixel 34G that emits green (G) light, and a sub-pixel 34B that emits blue (B) light. A red light-emitting element 27R, a green light-emitting element 27G, and a blue light-emitting element 27B are installed to correspond to the sub-pixels 34R, 34G, and 34B. Hereinafter, when the corresponding colors are not distinguished from each other, the sub-pixels 34R, 34G, and 34B are simply referred to as the sub-pixels 34 and the red light-emitting element 27R, the green light-emitting element 27G, and the blue light-emitting element 27B are simply referred to as the light-emitting elements 27.

Two scanning line driving circuits 16 (see FIG. 1) and an inspection circuit (not illustrated) are disposed in the circumference of the light-emitting region E. The inspection circuit is a circuit that inspects an operational state of the organic EL device 1. Cathode wirings (not illustrated) are disposed in the outer periphery of the element substrate 10. Also, a terminal section 37 is installed on one side of the element substrate 10. In the terminal section 37, the organic EL device 1 is connected to, for example, a flexible substrate including a driving IC.

In the organic EL device 1 according to the embodiment, a pixel 35 which is one unit at the time of formation of an image includes the sub-pixels 34R, 34G, and 34B. The organic EL device 1 can emit light with various kinds of colors by appropriately changing the luminance of the sub-pixels 34R, 34G, and 34B in each pixel 35. Thus, the organic EL device 1 can perform full-color display or full-color luminescence.

Figure 3:
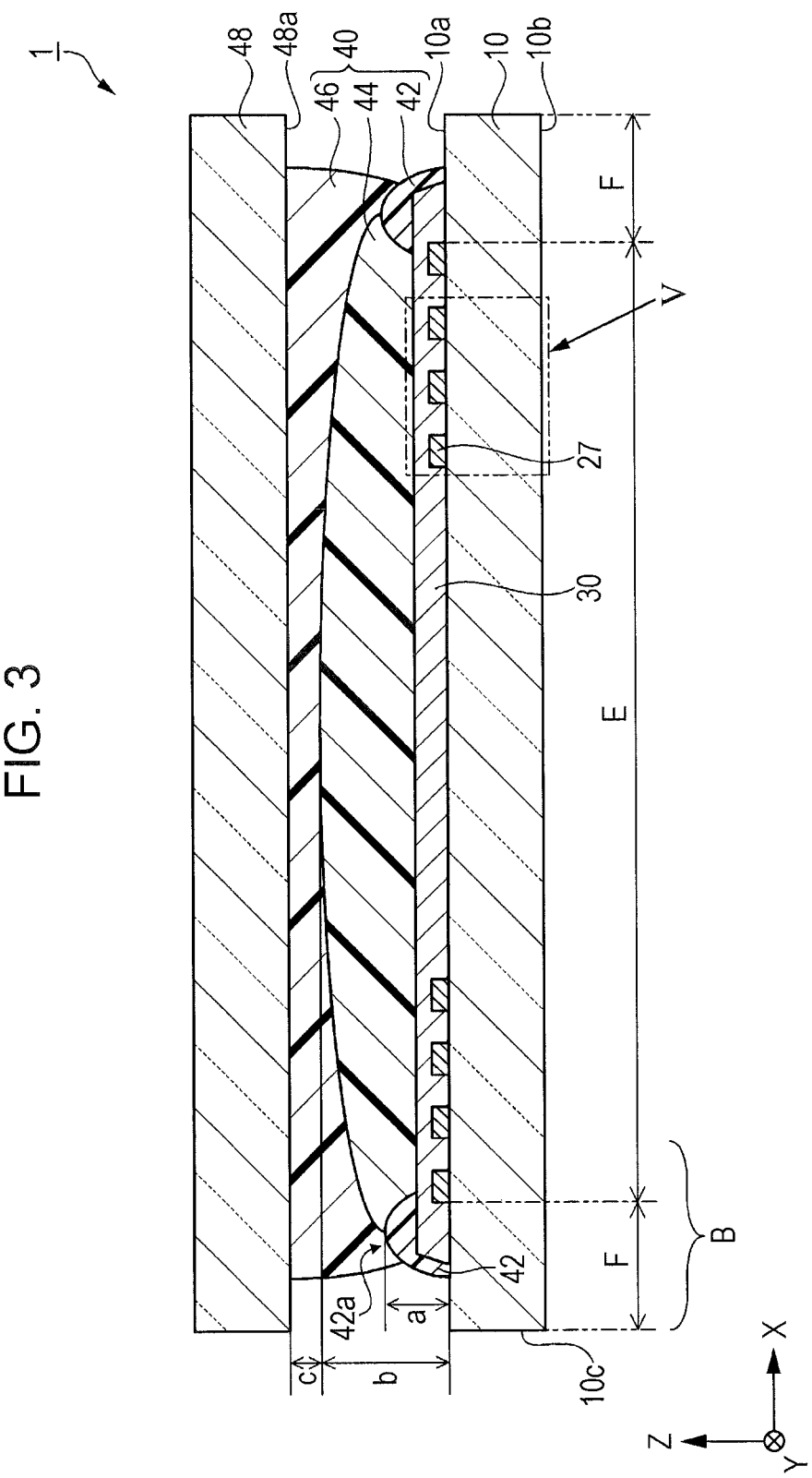
FIG. 3 is a schematic sectional view taken along the line III-III of FIG. 2.
Figure 4:
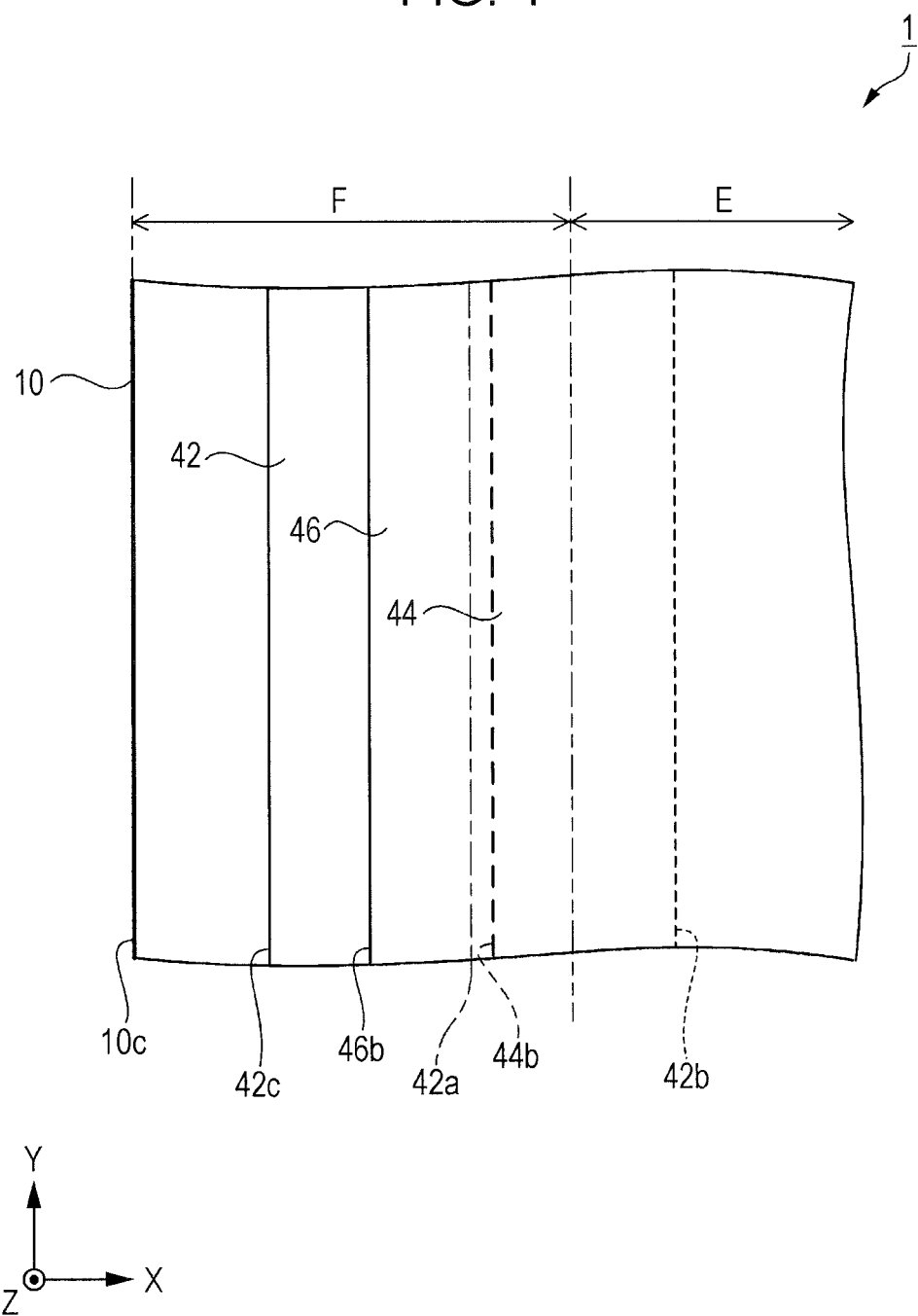
FIG. 4 is a schematic plan view illustrating a portion IV of FIG. 3.
Figure 5:
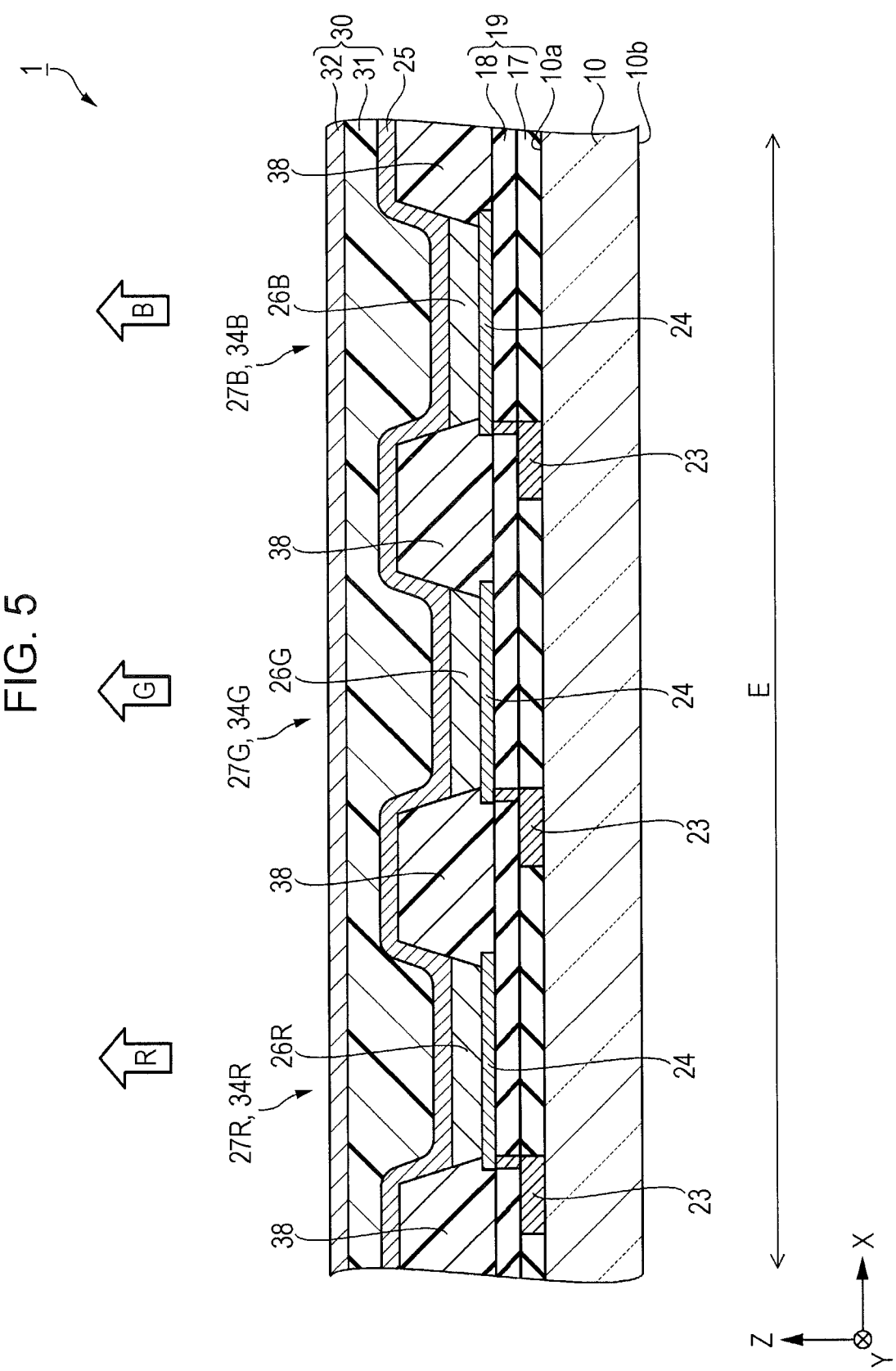
FIG. 5 is a schematic sectional view illustrating an expanded portion V of FIG. 3.

Next, the configuration of the organic EL device 1 according to the first embodiment will be described with reference to FIGS. 3 to 5. FIG. 3 is a schematic sectional view taken along the line of FIG. 2. FIG. 4 is a schematic plan view illustrating a portion IV of FIG. 3. FIG. 5 is a schematic sectional view illustrating an expanded portion V of FIG. 3. In FIG. 4, the counter substrate 48 is not illustrated.

As illustrated in FIG. 3, the organic EL device 1 includes the element substrate 10, the light-emitting elements 27 that are installed on the first surface 10a of the element substrate 10, a sealing layer 30 that covers the light-emitting elements 27, the counter substrate 48 that is a second substrate and is disposed so that the light-emitting elements 27 are interposed between the counter substrate 48 and the element substrate 10, and a resin layer 40 that is disposed between the light-emitting elements 27 and the counter substrate 48.

In the present specification, one direction parallel to the first surface 10a of the element substrate 10 is referred to as an X direction and a direction that is parallel to the first surface 10a and intersects the X direction is referred to as a Y direction. The thickness direction of the element substrate 10 intersecting the X and Y directions is referred to as a Z direction. Viewing the organic EL device 1 in the normal direction (Z direction) to the first surface 10a is referred to as a "plan view," as illustrated in FIG. 2, and viewing the cross-sectional surface of the organic EL device 1 in the Y direction is referred to as a "cross-sectional view," as illustrated in FIG. 3. The side of the counter substrate 48 (+Z direction) of the organic EL device 1 in FIG. 3 is referred to as an "upper side" and the side of the element substrate 10 (−Z direction) is referred to as a "lower side."

The element substrate 10 includes a second surface 10b on the lower side (the opposite side to the first surface 10a). The counter substrate 48 includes a surface 48a facing the first surface 10a of the element substrate 10. The element substrate 10 and the counter substrate 48 are formed of, for example, glass, quartz, a resin, or ceramic. The material of the element substrate 10 may be silicon (Si).

When the organic EL device 1 is a bottom emission type device that emits light coming from the light-emitting elements 27 to the lower side of the element substrate 10, a transmissive material is used for the element substrate 10. When the organic EL device 1 is a top emission type device that emits light coming from the light-emitting elements 27 to the side of the counter substrate 48 on the upper side, a transmissive material is used for the counter substrate 48. The details of the configuration of the light-emitting element 27 will be described below.

The resin layer 40 includes a casing 42, a first resin layer 44, and a second resin layer 46. The resin layer 40 has a function of adhering and fixing the element substrate 10 and the counter substrate 48 and a function of alleviating external stress or impact applied to the light-emitting elements 27 interposed between the element substrate 10 and the counter substrate 48. A total thickness (b+c in FIG. 3) of the resin layer 40 is, for example, about 100 µm.

As the materials of the casing 42, the first resin layer 44, and the second resin layer 46, for example, resin materials with transmittance such as an epoxy resin, an acrylic resin, a polyurethane resin, and a silicone resin can be used. Of these materials, an epoxy resin with a small degree of contraction (volume change) at the time of hardening is preferably used.

The casing 42 is installed on the first surface 10a of the element substrate 10. The casing 42 has a function of preventing the resin material of the first resin layer 44 from being wet and spread up to a range more than necessary when the first resin layer 44 is formed. The casing 42 is disposed to overlap with a part of the light-emitting elements 27 along the outer periphery of the light-emitting region E.

The casing 42 is preferably formed to cover the outer peripheral end portion of the sealing layer 30. By covering the outer peripheral end portion of the sealing layer 30 with the casing 42, it is possible to prevent the outer peripheral end portion of the sealing layer 30 from coming into contact with the outside. Thus, in a process of manufacturing the organic EL device 1, it is possible to prevent the sealing layer 30 from being damaged due to contact with cullet (glass debris) occurring, for example, when the organic EL device 1 (element substrate 10) is individually cut out from a mother substrate 11 (see FIGS. 8A to 8C) or due to contact with an exterior package, a jig, or the like when the exterior package is mounted on the organic EL device 1.

Although not illustrated, the planar shape of the casing 42 is a substantially rectangular casing shape formed along the outer periphery of the substantially rectangular light-emitting region E. The cross-sectional shape of the casing 42 is a convex shape formed by a curved line. A portion (hereinafter referred to as a thickest portion) with the thickest thickness in the film thickness of the casing 42 with the convex shape is denoted by 42a. The thickest portion 42a of the casing 42 is preferably disposed to be closer to the side of an end portion 10c of the element substrate 10 than the light-emitting region E.

The first resin layer 44 is installed to overlap with at least some of the light-emitting elements 27 and come into contact with a part (inside portion) of the casing 42. The light-emitting region E in which the light-emitting elements 27 are arrayed is covered with the casing 42 and the first resin layer 44. The first resin layer 44 has a function of alleviating external stress or impact applied to the light-emitting elements 27. Accordingly, the first resin layer 44 is preferably disposed to cover the entire light-emitting region E.

The planar shape of the first resin layer 44 is a substantially rectangular shape along the outer periphery of the light-emitting region E. The film thickness of the first resin layer 44 becomes gradually thicker with further separation from the casing 42 to the inside. Accordingly, the cross-sectional shape of the first resin layer 44 is a convex shape formed by a gently curved line that swells in its middle portion. By forming the cross-sectional shape of the first resin layer 44 as this convex shape, bubbles are rarely generated between the first resin layer 44 and the second resin layer 46. The thickness of the thickest portion (substantially middle portion in the X and Y directions) in the film thickness of the first resin layer 44 is preferably thicker than the thickness of the thickest portion 42a of the casing 42.

The second resin layer 46 is installed on the first resin layer 44 to come into contact with the first resin layer 44. The second resin layer 46 has a function of adhering and fixing the first resin layer 44 and the counter substrate 48 and a function of alleviating external stress or impact applied to the light-emitting elements 27 along with the first resin layer 44. The second resin layer 46 is preferably disposed to cover the surface of the first resin layer 44 and overlap with a part of the casing 42 further outside of the first resin layer 44.

The planar shape of the second resin layer 46 is a substantially rectangular shape along the outer periphery of the light-emitting region E. The film thickness of the second resin layer 46 becomes gradually thinner with further separation from the casing 42 to the inside. Accordingly, the cross-sectional shape of the second resin layer 46 is a concave shape formed by a gently curved line that is sunken in its middle portion. The counter substrate 48 is disposed on the second resin layer 46 to come into contact with the second resin layer 46.

A difference between the refractive index of the casing 42 and the refractive index of the first resin layer 44 is equal to or less than 0.05. Thus, since light reflection from the interface between the casing 42 and the first resin layer 44 is suppressed, a reduction in a light transmission amount due to light reflection from the light-emitting region E in which the light-emitting elements 27 are arrayed is suppressed to be small. As a result, it is difficult for a viewer to view the interface between the casing 42 and the first resin layer 44.

A difference between the refractive index of the casing 42 and the refractive index of the second resin layer 46 and a difference between the refractive index of the first resin layer 44 and the refractive index of the second resin layer 46 is equal to or less than 0.05. Thus, light reflection from the interface between the casing 42 and the second resin layer 46 and light reflection from the interface between the first resin layer 44 and the second resin layer 46 are suppressed. As a result, a reduction in a light transmission amount due to the light reflection from the light-emitting region E is suppressed to be smaller.

As illustrated in FIG. 4, the casing 42 includes an inner peripheral end portion 42b serving as a first end portion located on the side of the display region E and an outer peripheral end portion 42c serving as a second end portion located between the inner peripheral end portion 42b and the end portion 10c of the element substrate 10. The inner peripheral end portion 42b is disposed in the display region E and the outer peripheral end portion 42c is disposed in the frame region F. The thickest portion 42a of the casing 42 is preferably disposed in the frame region F.

An outer peripheral end portion 44b of the first resin layer 44 is disposed on the outside of the inner peripheral end portion 42b of the casing 42 and on the inside of the outer peripheral end portion 42c of the casing 42. That is, the first resin layer 44 is disposed to embed the inside of the inner peripheral end portion 42b of the casing 42 and to overlap with an inside portion of the casing 42 in the entire periphery within a range that does not exceed the outer peripheral end portion 42c. The outer peripheral end portion 44b of the first resin layer 44 is illustrated on the inside of the thickest portion 42a of the casing 42 in FIG. 4, but is preferably disposed to overlap with the thickest portion 42a of the casing 42.

An outer peripheral end portion 46b of the second resin layer 46 is disposed between the outer peripheral end portion 44b of the first resin layer 44 and the outer peripheral end portion 42c of the casing 42. That is, the second resin layer 46 is disposed to cover the first resin layer 44 and to overlap with the casing 42 on the outside of the first resin layer 44.

In the present specification, the side of the end portion 10c of the element substrate 10 when viewed from the side of the display region E is referred to as an "outside" and the side of the display region E when viewed from the side of the end portion 10c of the element substrate 10 is referred to as an "inside."

Referring back to FIG. 3, a ratio of the thickness (indicated by b in FIG. 3) of the thickest portion of the first resin layer 44 to the thickness (indicated by a in FIG. 3) of the thickest portion 42a of the casing 42 is equal to or greater than 2:1 and is equal to or less than 5:1. That is, the thickness b of the thickest portion of the first resin layer 44 is equal to or greater than double the thickness a of the thickest portion 42a of the casing 42 and is equal to or less than 5 times thereof. A ratio of the thickness (indicated by c in FIG. 3) of the thinnest portion in the film thickness of the second resin layer 46 to the thickness (indicated by b in FIG. 3) of the thickest portion of the first resin layer 44 is equal to or greater than 1:9 and is equal to or less than 3:7. That is, the thickness c of the thinnest portion in the film thickness of the second resin layer 46 is equal to or greater than 1/9 of the thickness b of the thickest portion of the first resin layer 44 and is equal to or less than 3/7 thereof. For example, when a total thickness of the resin layer 40 is about 100 μm, the thickness a can be set to be in the range of about 20 μm to about 30 μm, the thickness b can be set to be in the range of about 70 μm to about 90 μm, and the thickness c can be set to be in the range of about 10 μm to about 30 μm.

By setting the ratio between the thicknesses of the casing 42 and the first resin layer 44 to be in the foregoing ranges, it is possible to cause the surface of the first resin layer 44 to swell in the convex shape upward more than the thickest portion 42a of the casing 42 and to cause the wet-spreading of the material to stop at the thickest portion 42a of the casing 42 when the first resin layer 44 is formed. When the surface of the first resin layer 44 is sunken in a concave shape, a void occurs between the first resin layer 44 and the second resin layer 46, and thus bubbles can easily be generated. However, by causing the surface of the first resin layer 44 to swell in the convex shape, it is possible to prevent the bubbles from being generated. Also, it is possible to prevent the first resin layer 44 from being formed up to the outside beyond the casing 42 while disposing the first resin layer 44 within the range in which the light-emitting elements 27 are covered.

By setting the ratio between the thickness of the first resin layer 44 and the second resin layer 46 to be in the foregoing range, it is possible to cause the wet-spreading of the material to stop within the range not exceeding the outer peripheral end portion 42c of the casing 42, while disposing the material of the second resin layer 46 within the range in which the second resin layer 46 covers the first resin layer 44 and reaches up to the casing 42, at the time of the formation of the second resin layer 46. Thus, it is possible to prevent the second resin layer 46 from being formed up to the outside beyond the casing 42, while disposing the second resin layer 46 within the range covering the light-emitting elements 27.

The film thickness of the casing 42 and the film thickness of the first resin layer 44 refer to distances between the first surface 10a of the element substrate 10 and the surfaces of these films on the upper side in the Z direction. Also, the film thickness of the second resin layer 46 refers to a distance between the surface 48a of the counter substrate 48 and the surface of the film of the second resin layer 46 on the lower side in the Z direction.

Since the organic EL device 1 includes the resin layer 40 having the above-described configuration, it is possible to limit the frame region F to be smaller and prevent the wet-spreading of the resin material more than necessary, a variation in the wet-spreading, and generation of the bubbles. Also, since the reflection from the interfaces between the casing 42, the first resin layer 44, and the second resin layer 46 in the resin layer 40 is suppressed, the reduction in the light transmission amount in the light-emitting region E can be suppressed to be smaller. Thus, since the light-emitting region E can be set to be larger with respect to the outer appearance of the element substrate 10, it is possible to provide the organic EL device 1 capable of emitting light coming from the light-emitting elements 27 more brightly.

Next, the configuration of the light-emitting element 27 will be described. As illustrated in FIG. 5, the organic EL device 1 includes: the element substrate 10; a circuit element layer 19, the anode 24, a partition wall (bank) 38, the light-emitting functional layers 26 (26R, 26G, and 26B), and the cathode (common electrode) 25 installed on the element substrate 10; and the sealing layer 30. Hereinafter, when the corresponding colors are not distinguished from each other, the light-emitting functional layers 26R, 26G, and 26B are simply referred to as the light-emitting functional layers 26.

The circuit element layer 19 includes the driving transistor 23, a first inter-layer insulation film 17, and a second inter-layer insulation film 18. A lower layer of the circuit element layer 19 may include an underlying protective film formed to cover the element substrate 10.

The driving transistor 23 is installed in each of the sub-pixels 34 (34R, 34G, and 34B) on the element substrate 10. Although not illustrated in detail, the driving transistor 23 includes a semiconductor film, a gate insulation film, a gate electrode, a drain electrode, and a source electrode.

The first inter-layer insulation film 17 is formed of, for example, a silicon oxide film ($SiO_2$) or a titanium oxide film ($TiO_2$) and is installed to cover the gate insulation film and the gate electrode. The source electrode and the drain electrode are formed on the first inter-layer insulation film 17.

The source electrode is electrically connected to a source region of the semiconductor film via a contact hole installed in the first inter-layer insulation film 17. The drain electrode is conductively connected to a drain region of the semiconductor film via a contact hole installed in the first inter-layer insulation film 17.

The second inter-layer insulation film 18 is formed of, for example, a silicon oxide film ($SiO_2$) or a titanium oxide film ($TiO_2$) and is installed to cover the first inter-layer insulation film 17, the source electrode, and the drain electrode. The second inter-layer insulation film 18 may be formed of an acrylic resin or the like.

The anode 24 is installed in each of the sub-pixels (34R, 34G, and 34B) on the second inter-layer insulation film 18. The anode 24 is formed of, for example, metallic oxide such as ITO (Indium Tin Oxide) or IZO (Indium Zinc Oxide) or an alloy thereof. The anode 24 is, for example, formed in a substantially rectangular shape in a plan view. The anode 24 is electrically connected to the drain electrode of the driving transistor 23 via a contact hole installed in the second inter-layer insulation film 18.

The partition walls 38 are installed in a substantially lattice shape in a plan view on the second inter-layer insulation film 18. The partition wall 38 has, for example, a trapezoidal shape of which a cross-sectional shape has an inclined surface, ensures an insulation property between the adjacent anodes 24, and is formed to override with a predetermined width on the circumference of the anode 24 so that the shape of the sub-pixel 34 becomes a desired shape (for example, a track shape). In other words, an opening of the partition wall 38 serves as the region of the sub-pixel 34. The partition wall 38 is formed of, for example, an organic material having heat resistance and solvent resistance, such as an acrylic resin or a polyimide resin. An insulation layer formed of, for example, an inorganic material such as a silicon oxide film ($SiO_2$) may be installed between the second inter-layer insulation film 18 and the partition wall 38.

The light-emitting functional layer 26 is installed on the anode 24 in a region partitioned by the partition walls 38. The light-emitting functional layer 26 is different in each of the sub-pixels 34 (34R, 34G, and 34B), that is, each of the light-emitting elements 27 (27R, 27G, and 27B). The light-emitting functional layer 26R emitting red light is disposed in the sub-pixel 34R (light-emitting element 27R), the light-emitting functional layer 26G emitting green light is disposed in the sub-pixel 34G (light-emitting element 27G), and the light-emitting functional layer 26B emitting blue light is disposed in the sub-pixel 34B (light-emitting element 27B).

The light-emitting functional layer 26 has a light-emitting layer (electroluminescence layer) formed of an organic material. The light-emitting functional layer 26 may be configured to include other layers such as a hole transport layer, a hole injection layer, an electron injection layer, an electron transport layer, a hole-blocking layer, and an electron-blocking layer in addition to the light-emitting layer. When the organic EL device 1 is a top emission type device, respective color light coming from the light-emitting functional layers 26 (26R, 26G, and 26B) is emitted upward, as illustrated in FIG. 5.

On the light-emitting functional layer 26, the cathode 25 is installed to cover the partition wall 38 and the light-emitting functional layer 26. The cathode 25 is formed of, for example, metal such as calcium (Ca), magnesium (Mg), sodium (Na), or lithium (Li) or an alloy compound thereof. A cathode protective layer covering the cathode 25 may also be installed between the cathode 25 and the sealing layer 30.

The sealing layer 30 is installed to cover the cathode 25. The sealing layer 30 includes a buffer layer 31 and a gas barrier layer 32. The buffer layer 31 has a function of alleviating an unevenness of the surface of the light-emitting elements 27 caused in the partition wall 38 and the upper surface of the buffer layer 31 is formed to be substantially flat. The buffer layer 31 also has a function of alleviating curving or stress occurring from the side of the element substrate 10 and preventing the cathode 25 from peeling from the partition wall 38. The buffer layer 31 is formed of a polymer material (organic resin material) having a lipophilic property, for example, a material such as a polyolefin-based resin, a polyether-based resin, an epoxy resin, an acrylic resin, a silicone resin, polyurethane, polyether, or polyester.

The gas barrier layer 32 is installed to cover the buffer layer 31. The gas barrier layer 32 has a function of preventing oxygen or moisture from infiltrating the inside thereof. Thus, since oxygen or moisture is prevented from infiltrating the cathode 25 or the light-emitting functional layer 26, it is possible to prevent the cathode 25 or the light-emitting functional layer 26 from deteriorating. The gas barrier layer 32 is formed of, for example, an inorganic compound such as a silicon oxide film ($SiO_2$), a silicon nitride film (SiN), or a silicon oxynitride film (SiON). The gas barrier layer 32 is, for example, formed in a hard and dense film by a high-density plasma film forming method or the like.

Since the upper surface of the buffer layer 31 is formed to be substantially flat, the film thickness of the gas barrier layer 32 formed as a hard film on the buffer layer 31 is almost uniform. Thus, since focusing of the stress on a specific portion in the gas barrier layer 32 is suppressed, cracking can be prevented from occurring in the gas barrier layer 32.

Here, the organic EL device 1 having the configuration in which the light-emitting functional layers 26 emit the color light of red (R), green (G), and blue (B) has been described as an example. However, the organic EL device 1 may have a configuration in which the light-emitting functional layers 26 emit white light and color filters transmitting the color light of red (R), green (G), and blue (B) are provided. Also, the organic EL device 1 may have an optical resonance structure that resonates light with wavelength bands of red (R), green (G), and blue (B).

Method of Manufacturing Organic EL Device

Next, a method of manufacturing the organic EL device according to the first embodiment will be described with reference to FIGS. 5 to 9C. FIGS. 6A to 6D, 7A to 7C, 8A to 8C, and 9A to 9C are schematic diagrams illustrating the method of manufacturing the organic EL device according to the first embodiment. FIGS. 6A to 6D and 7A to 7C correspond to the schematic sectional views taken along the line of FIG. 2. FIGS. 8A to 8C and 9A to 9C correspond to the schematic plan views when viewed from the normal direction to the first surface 10a of the element substrate 10.

The organic EL device 1 is processed in the state of the large-scale mother substrate 11 from which a plurality of the organic EL devices 1 (element substrates 10) can be obtained. Then, the plurality of organic EL devices 1 can finally be obtained by individually cutting out the organic EL devices 1 (element substrates 10) from the mother substrate 11. FIGS. 6A to 6D and 7A to 7C show the state of the individual element substrate 10 in the mother substrate 11 and FIGS. 8A to 8C and 9A to 9C show the state of the mother substrate 11.

First, as illustrated in FIG. 5, the circuit element layer 19, the partition walls 38, the light-emitting elements 27 (the anodes 24, the light-emitting functional layers 26, and the cathodes 25), and the sealing layer 30 are formed on the first surfaces 10a of the element substrate 10 (mother substrate 11) using known technologies. The light-emitting elements 27 are disposed in the light-emitting region E on the first surface 10a. Here, the cathode 25 may be disposed up to the frame region F (see FIG. 3) as well as the light-emitting region E.

Figure 6A:
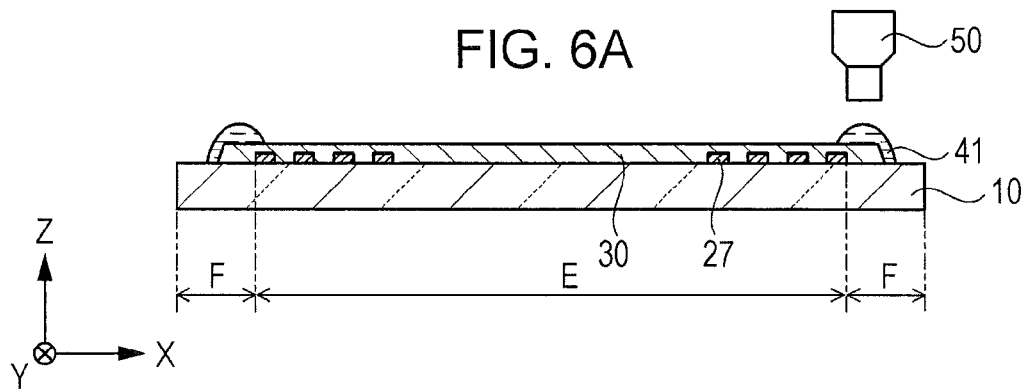
FIGS. 6A to 6D are schematic diagrams illustrating a method of manufacturing the organic EL device according to the first embodiment.
Figure 8A:
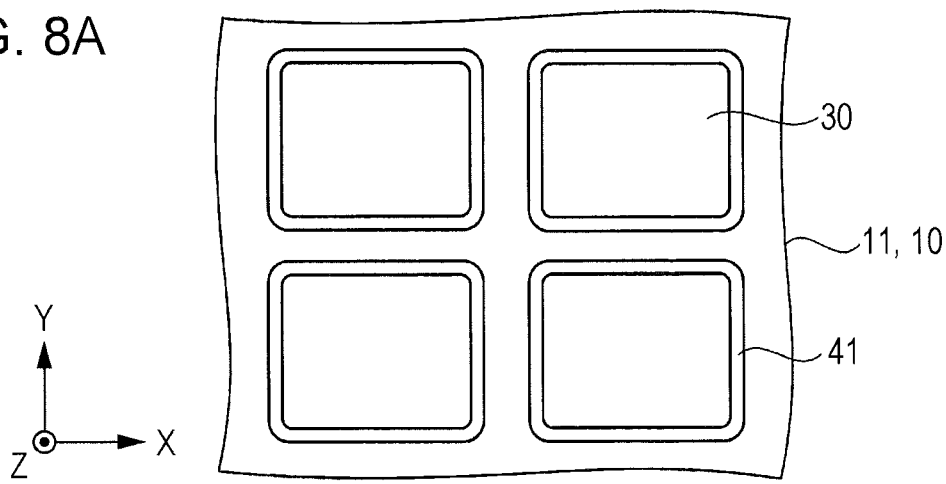
FIGS. 8A to 8C are schematic diagrams illustrating the method of manufacturing the organic EL device according to the first embodiment.

Next, as illustrated in FIGS. 6A and 8A, a first material 41 forming the casing 42 is applied to the element substrate 10 (mother substrate 11) in which the light-emitting elements 27 are disposed. For example, the first material 41 is disposed to be astride the light-emitting region E and the frame region F along the outer periphery of the light-emitting region E using a dispenser 50 or the like. The width (a gap between the inner periphery end portion and the outer periphery end portion) of the disposed first material 41 is, for example, about 400 μm.

At this time, the first material 41 may be applied only to the frame region F without being astride the light-emitting region E. However, in this case, the frame region F may be consequently larger. In the embodiment, to limit the frame region F to be smaller, the first material 41 is disposed such that the inner peripheral end portion 42*b* of the casing 42 to be formed is disposed in the display region E and the outer peripheral end portion 42*c* is disposed in the frame region F (see FIG. 4).

The first material 41 is preferably disposed such that the thickest portion 42*a* (see FIG. 4) of the casing 42 to be formed is disposed in the frame region F. The casing 42 has a function of preventing a second material 43 from being wet and spread more than necessary when the second material 43 forming the first resin layer 44 to be described below is applied, but the thickest portion 42*a* of the casing 42 serves as a portion that serves to stop the wet-spreading of the second material 43. For example, when the width (a gap between the inner peripheral end portion 42*b* and the outer peripheral end portion 42*c*) of the casing 42 is about 400 μm, the thickest portion 42*a* is preferably disposed about 50 μm outside the outer periphery end portion of the light-emitting region E.

As described above, an epoxy resin is preferably used as the first material 41. When an epoxy resin is used, the degree of contraction at the time of the hardening of the first material 41 can be suppressed to be small when the casing 42 is formed, compared to the case in which another resin material is used. When the degree of contraction at the time of the hardening of the first material 41 is large, curving or distortion of the element substrate 10 may easily occur.

A thermosetting or UV (ultraviolet) hardening bisphenol A-type epoxy resin or bisphenol F-type epoxy resin can be used as the epoxy resin. In the embodiment, however, a UV hardening epoxy resin is preferably used. In regard to a thermosetting resin, a hardening speed is slower and heating is necessary to accelerate the hardening, compared to a UV hardening resin. For this reason, since a thermosetting resin is softened once and is gradually hardened at the time of heating to accelerate the hardening, the applied material is easily wet and spread and its shape easily varies compared to a UV hardening resin. Therefore, when it is desired to limit the frame region F to be smaller, a UV hardening resin is preferred to a thermosetting resin.

A resin material with higher viscosity than the second material 43 or a third material 45 to be described below is used as the first material 41. When a material with high viscosity is used as the first material 41, the wet-spreading is suppressed to be smaller until the first material 41 is hardened. Therefore, the distance between the inner peripheral end portion 42*b* and the outer peripheral end portion 42*c* of the casing 42 to be formed can be suppressed to be small and the cross-section of the casing 42 can be formed in a convex shape. The viscosity of the first material 41 is equal to or greater than 10,000 cps and is equal to or less than 100,000 cps. When the viscosity exceeds 100,000 cps, the transmittance of the casing 42 to be formed deteriorates. When the viscosity of the first material 41 is set to be equal to or less than 100,000 cps, the transmittance in the light-emitting region E can be prevented from deteriorating in spite of the fact that the casing 42 is disposed in the light-emitting region E.

Figure 6B:
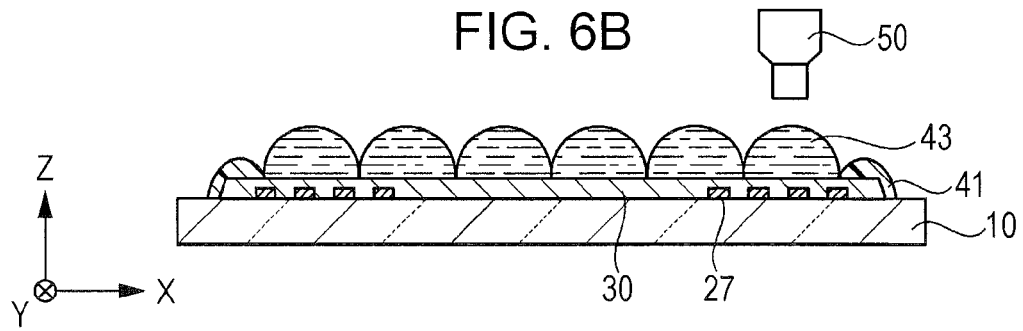
Figure 8B:
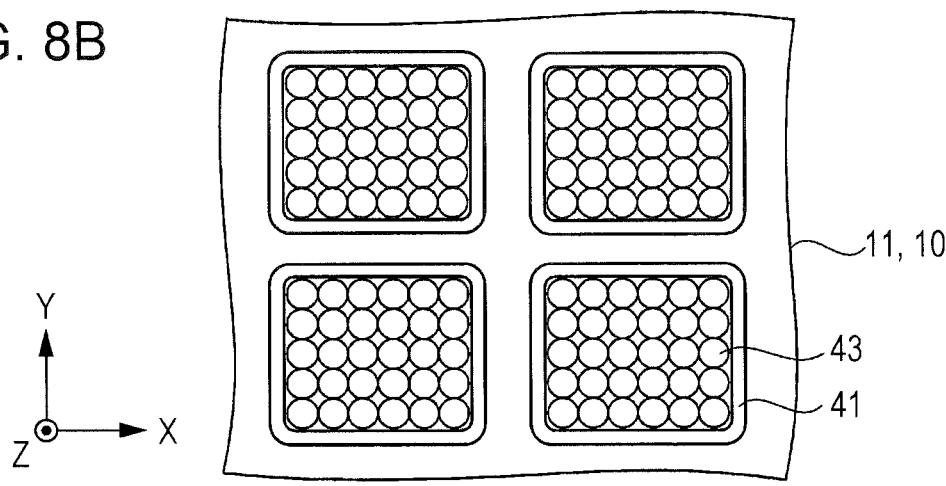

Next, as illustrated in FIGS. 6B and 8B, the second material 43 forming the first resin layer 44 is applied to the element substrate 10 (mother substrate 11). For example, the second material 43 is disposed on the inside of the first material 41 disposed in a casing shape using the dispenser 50 or the like. FIGS. 6B and 8B show a state immediately after the second material 43 with a liquid droplet shape is applied. An application amount (volume) of the second material 43 is determined so that its film thickness after leveling to be described below is thicker than the film thickness of the first material 41.

Due to the same reasons as the first material 41, a UV (ultraviolet) hardening bisphenol A-type epoxy resin or bisphenol F-type epoxy resin is preferably used as the second material 43. A resin material with lower viscosity than the first material 41 is used as the second material 43. When the material with low viscosity is used as the second material 43, the second material 43 is satisfactorily wet and spread. Therefore, since the first resin layer 44 to be formed can cover the light-emitting elements 27, it is possible to smooth the surface of the first resin layer 44 and thus prevent bubbles from being generated.

The viscosity of the second material 43 is equal to or greater than 10 cps and is equal to or less than 1,000 cps. When the viscosity exceeds 1,000 cps, it is difficult to perform wet-spreading of the second material 43. When the viscosity of the second material 43 is set to be equal to or less than 1,000 cps, the second material 43 is satisfactorily wet and spread to cover the light-emitting elements 27 and the sealing layer 30, thereby preventing bubbles between the second material 43 and the third material 45 disposed in an upper layer from being generated. As described above, the difference between the refractive index of the first material 41 and the refractive index of the second material 43 is set to be equal to or less than 0.05.

Figure 6C:
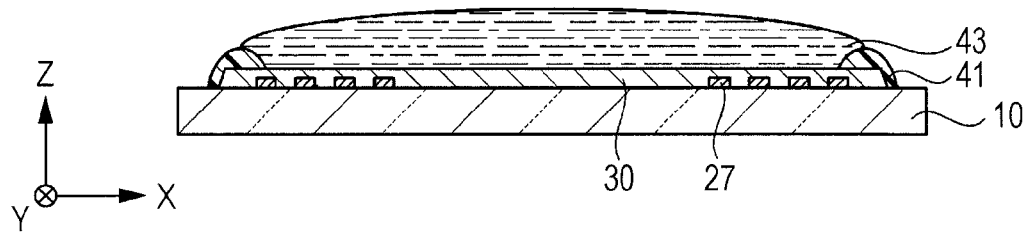
Figure 8C:
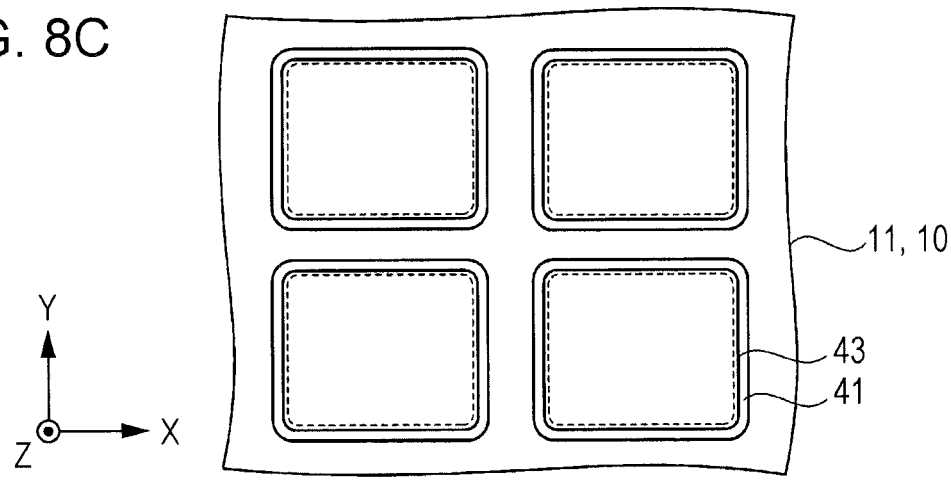

Next, as illustrated in FIGS. 6C and 8C, the second material 43 applied to the element substrate 10 (mother substrate 11) is left for a predetermined time and leveling is performed to perform the wet-spreading of the second material 43. When the second material 43 is wet and spread, the surface of the second material 43 is formed in a gently curved shape due to surface tension of the second material 43 and the film thickness of the second material 43 becomes thicker with further separation from the first material 41 to the inside. Thus, by disposing the second material 43 in the convex shape formed by a gently curved line that swells in its middle portion, it is possible to cause bubbles to be rarely generated between the second material 43 and the third material 45 to be disposed subsequently.

The end portion of the wet and spread second material 43 is preferably disposed on the outside of the light-emitting region E and on the inside of the outer peripheral end portion of the first material 41. Since the cross-sectional shape of the previously disposed first material 41 is the convex shape, the end portion of the wet and spread second material 43 can be stopped near the position of the thickest portion (the thickest portion 42*a* of the casing 42 illustrated in FIG. 4) of the first material 41. Accordingly, by disposing the thickest portion (thickest portion 42*a*) of the first material 41 on the slightly outside the light-emitting region E, the range of the wet-spreading of the second material 43 can be controlled.

Even when the end portion of the second material 43 is within the light-emitting region E, the light-emitting region E can be covered with the first resin layer 44 and the casing 42 to be formed as long as the end portion of the second material 43 is disposed on the outside of the inner peripheral end portion of the first material 41. Even in this case, since the difference between the refractive index of the first material 41 and the refractive index of the second material 43 is equal to or less than 0.05, it is difficult for a viewer to see the interface between the first resin layer 44 and the casing 42 to be formed and the transmittance in the light-emitting region E is prevented from deteriorating.

Figure 6D:
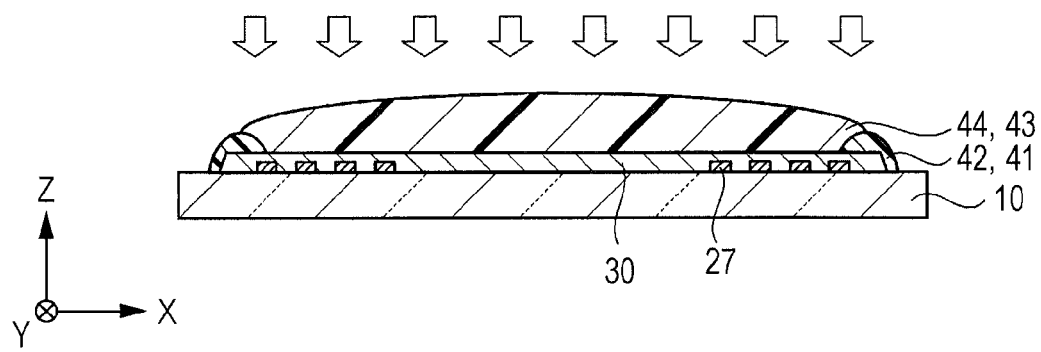

Next, as illustrated in FIG. 6D, the first material 41 and the second material 43 applied to the element substrate 10

Figure 9A:
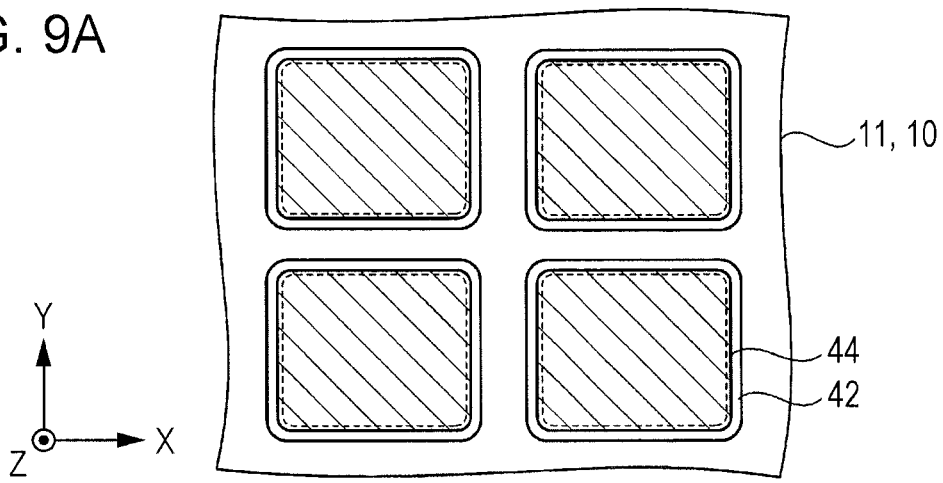
FIGS. 9A to 9C are schematic diagrams illustrating the method of manufacturing the organic EL device according to the first embodiment.

(mother substrate 11) are hardened together by irradiating the first material 41 and the second material 43 with UV (ultraviolet) light. Thus, as illustrated in FIG. 9A, the casing 42 and the first resin layer 44 are formed. By hardening the first material 41 and the second material 43 together, the first material 41 and the second material 43 can be contracted together and affinity between both of the first material 41 and the second material 43 can be improved, compared to the case in which the materials are individually hardened. Thus, it is possible to cause the interface between the casing 42 and the first resin layer 44 to be difficult to see. Also, even when the inner peripheral end portion 42b (see FIG. 4) of the casing 42 is disposed in the light-emitting region E, a difference in transmittance between a portion in which the casing 42 is disposed in the light-emitting region E and a portion in which the casing 42 is not disposed is suppressed to be small, and thus irregularity of luminescence (display) is prevented.

Figure 7A:
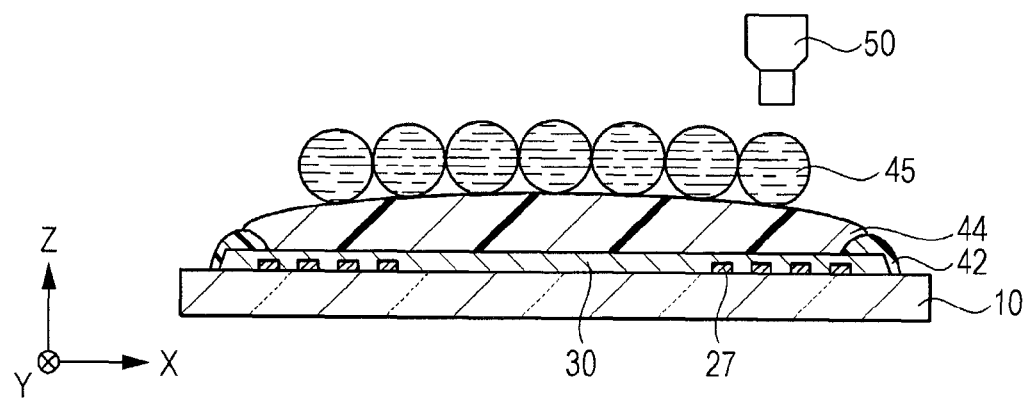
FIGS. 7A to 7C are schematic diagrams illustrating the method of manufacturing the organic EL device according to the first embodiment.
Figure 9B:
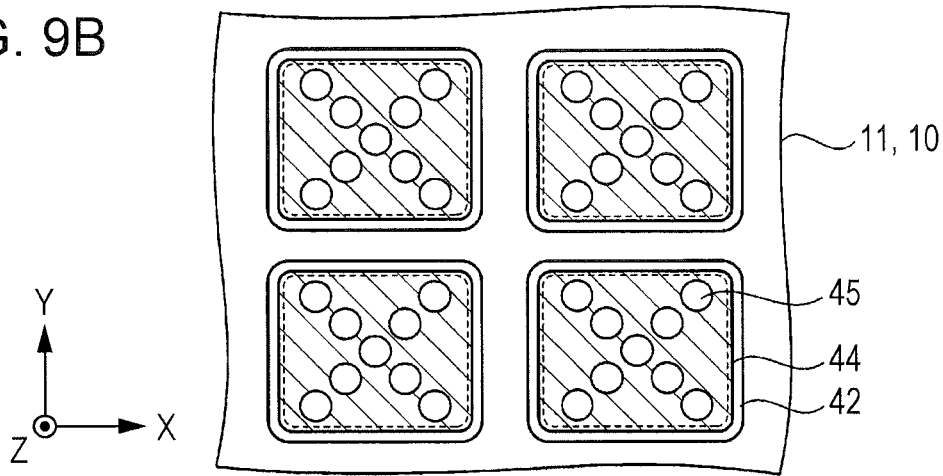

Next, as illustrated in FIGS. 7A and 9B, the third material 45 forming the second resin layer 46 is applied to the first resin layer 44. For example, the third material 45 is disposed on the inside of the outer peripheral end portion 42c of the casing 42 using the dispenser 50 or the like. FIGS. 7A and 9B show a state immediately after the third material 45 with a liquid droplet shape is applied.

As in the second material 43, a material which is a UV hardening epoxy resin and a resin material with lower viscosity than the first material 41 is preferably used as the third material 45. As described above, the difference between the refractive index of the first material 41 and the refractive index of the third material 45 and the difference between the refractive index of the second material 43 and the refractive index of the third material 45 are set to be equal to or less than 0.05. In the embodiment, since an epoxy resin is used as the first material 41, the second material 43, and the third material 45, the differences between the refractive indexes of these materials can be suppressed to be small.

To improve the transmittance in the light-emitting region E, the first material 41, the second material 43, and the third material 45 disposed in the light-emitting region E preferably have transmittances that can transmit 80% or more of light with a wavelength band of 400 nm to 700 nm when the film thicknesses of the first material 41, the second material 43, the third material 45 are set to 100 µm.

Figure 7B:
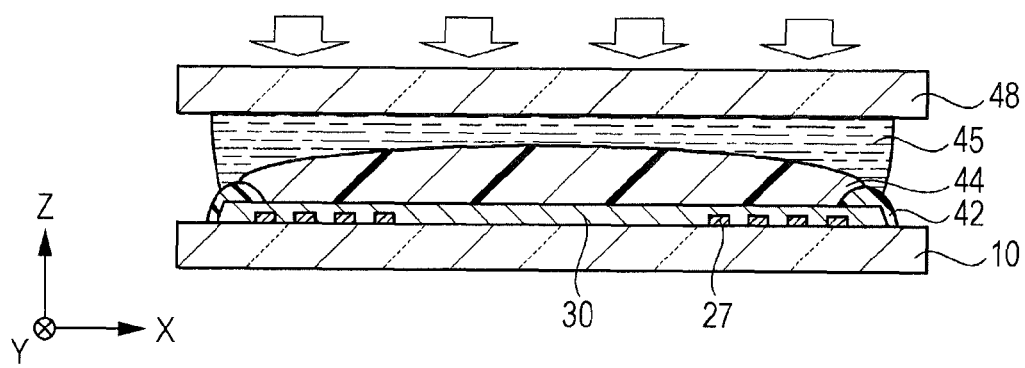

Next, as illustrated in FIG. 7B, the counter substrate 48 is disposed on the third material 45 and its load is applied from the side of the counter substrate 48 to the side of the element substrate 10 (mother substrate 11). Thus, the third material 45 is wet and spread to the outside (the side of the casing 42) between the first resin layer 44 and the counter substrate 48. The third material 45 is wet and spread along the surface of the first resin layer 44 and its film thickness becomes thinner with further separation from the casing 42 to the inside.

The end portion of the wet and spread third material 45 is preferably disposed on the outside of the light-emitting region E and on the inside of the outer peripheral end portion 42c (see FIG. 4) of the casing 42 and is more preferably the same as or on the outside of the outer peripheral end portion 44b (see FIG. 4) of the first resin layer 44.

Here, when the first resin layer 44 is formed in a concave shape in which the film thickness becomes thinner with further separation from the casing 42 to the inside, a void easily occurs between the first resin layer 44 and the third material 45. When the void occurs between the first resin layer 44 and the third material 45, it is difficult for the air to move from the void to the outside, and thus bubbles may be generated. In the embodiment, since the first resin layer 44 is formed in the convex shape in which the film thickness becomes thicker with further separation from the casing 42 to the inside (the film thickness becomes thinner approaching the side of the casing 42), the void rarely occurs between the first resin layer 44 and the third material 45 and the air easily moves to the outside.

Further, since the outer peripheral end portion 44b of the first resin layer 44 is formed up to the vicinity of the position of the thickest portion 42a of the casing 42, the air moves outward from the space between the third material 45 and the first resin layer 44 to the space between the third material 45 and the casing 42 and easily comes out to the outside of the casing 42. Thus, it is possible to prevent the bubbles from being generated between the first resin layer 44 and the third material 45.

Since the cross-sectional shape of the casing 42 is the convex shape and has a steep inclined surface toward the outside, the end portion of the wet and spread third material 45 is stopped on the inside of the outer peripheral end portion 42c of the casing 42 due to its own surface tension, and thus the wet-spreading to the outside of the third material 45 is suppressed. Since the end portion of the third material 45 is disposed between the thickest portion 42a and the outer peripheral end portion 42c of the casing 42, the frame region F can be suppressed to be small and the light-emitting region E can be covered with the third material 45. Also, since the contact area between the third material 45 and both of the side of the element substrate 10 (mother substrate 11) and the side of the counter substrate 48 can be large, a sufficient adhesion strength can be obtained.

Figure 7C:
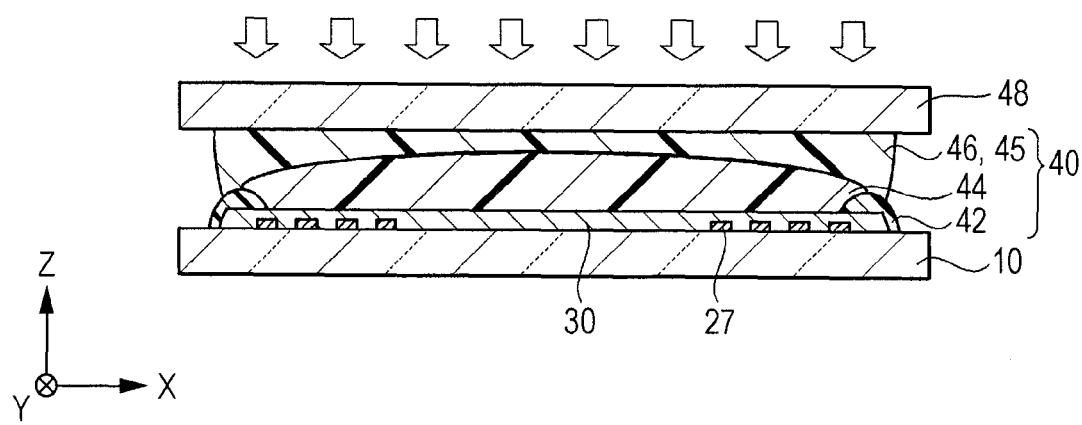
Figure 9C:
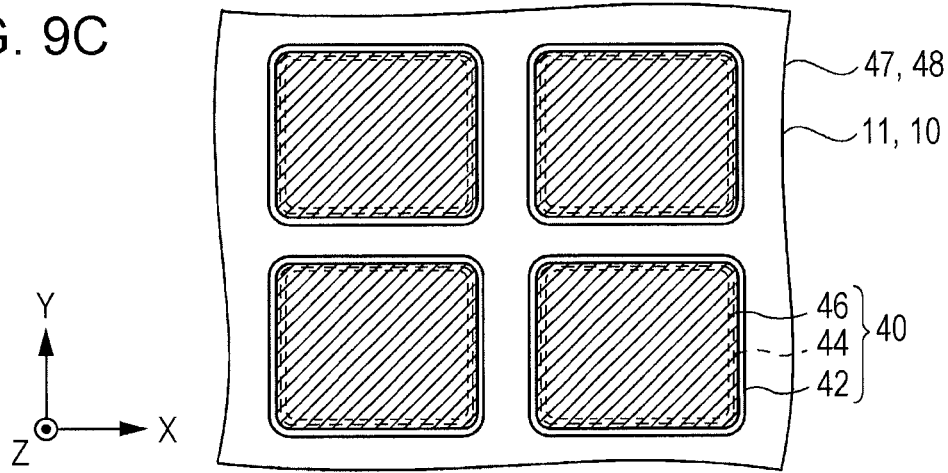

Next, as illustrated in FIG. 7C, the third material 45 is hardened by irradiating the third material 45 with UV light. Thus, as illustrated in FIGS. 7C and 9C, the second resin layer 46 is formed, and thus the first resin layer 44 and the counter substrate 48 are adhered by the second resin layer 46. As a result, the element substrate 10 (mother substrate 11) and the counter substrate 48 are adhered and fixed. Thereafter, the plurality of organic EL devices 1 can be obtained by individually cutting out the organic EL devices 1 (element substrates 10) from the mother substrate 11.

As described above, in the process of forming the second resin layer 46, the radiation of the UV light has been performed after applying the load on the third material 45. However, the order may be different due to the characteristics or the like of the resin material to be used and the radiation of the UV light may be performed in the loaded state. For example, when a resin material for which the radiation of the UV light is performed and the hardening subsequently starts after a little time elapses, the loading and the hardening may be performed after the irradiation of the third material 45 with the UV light.

In the process of forming each of the casing 42, the first resin layer 44, and the second resin layer 46, the application amount (volume) of each of the first material 41, the second material 43, and the third material 45 is adjusted in the following manner according to the sizes (areas) of the light-emitting region E and the frame region F and the gap between the element substrate 10 and the counter substrate 48. That is, the application amount of each material is appropriately adjusted so that the thickness b of the thickest portion of the formed first resin layer 44 is equal to or greater than double the thickness a of the thickest portion 42a of the casing 42 and is equal to or less than five times the thickness a, and the thickness c of the thinnest portion in the film thickness of the second resin layer 46 is equal to or greater than 1/9 of the thickness b of the thickest portion of the first resin layer 44 and is equal to or less than 3/7 of the thickness b.

As described above, a variation in the shape and the dimensional precision of the casing 42 is suppressed by using a material with high viscosity as the first material 41 forming the casing 42. By using materials with low viscosity as the second material 43 forming the first resin layer 44 and the third material 45 forming the second resin layer 46, it is possible to satisfactorily cover the surface of the sealing layer 30 and the light-emitting elements 27 in the light-emitting region E. Also, by suppressing a variation in the shape and the dimensional precision of the casing 42 (the first material 41), it is possible to suppress the wet-spreading of the second material 43 and the third material 45 to be within an appropriate range. Thus, it is possible to set the frame region F of the organic EL device 1 to be small.

According to the first embodiment, as described above, it is possible to obtain the following advantages.

(1) The casing 42 is installed to overlap with a part of the light-emitting elements 27 along the outer periphery of the light-emitting region E in which the light-emitting elements 27 are disposed, and the first resin layer 44 is disposed to overlap with at least some of the light-emitting elements 27 on the inside of the outer peripheral end portion 42c of the casing 42. That is, the casing 42 is disposed to surround the periphery of the first resin layer 44 formed on the light-emitting elements 27. Therefore, when the first resin layer 44 is formed on the light-emitting elements 27, the excessive wet-spreading of the second material 43 to be disposed is suppressed by the casing 42, and thus the frame region F in the first surface 10a can be set to be small. For example, when a process is performed on the large-scale mother substrate 11 from which the plurality of organic EL devices 1 can be obtained, a variation in the wet-spreading of the second material 43 in the same mother substrate 11 is suppressed by the casing 42. Thus, it is possible to provide the organic EL device 1 in which the frame region F is suppressed to be small and the variation is small.

(2) The film thickness of the first resin layer 44 becomes thicker with further separation from the casing 42 and the first resin layer 44 is formed in the convex shape. Therefore, when the element substrate 10 and the counter substrate 48 are bonded, a void rarely occurs between the first resin layer 44 and the second resin layer 46. Also, the first resin layer 44 has the film thickness thicker than the casing 42. Therefore, even when the second resin layer 46 is disposed to be astride the first resin layer 44 and the casing 42, the air between the first resin layer 44 and the second resin layer 46 easily moves outside. Thus, it is possible to prevent bubbles from being generated between the first resin layer 44 and the second resin layer 46.

(3) The outer peripheral end portion 42c of the casing 42 is disposed in the frame region F on the outside of the light-emitting region E, and the first resin layer 44 is disposed to embed the inside of the casing 42 and come into contact with the casing 42 up to the outside of the inner peripheral end portion 42b of the casing 42. Therefore, the light-emitting region E is covered with the casing 42 and the first resin layer 44, while the wet-spreading of the second material 43 is suppressed by the casing 42 and the frame region F is caused to be small, and thus stress or impact on the light-emitting elements 27 can be alleviated.

(4) Since the inner peripheral end portion 42b of the casing 42 is disposed in the light-emitting region E, the casing 42 can be disposed to be near the inside of the end portion 10c of the element substrate 10, compared to the case in which the inner peripheral end portion 42b is disposed in the frame region F. Also, since the thickest portion 42a of the casing 42 that can stop the wet-spreading of the second material 43 at the time of the formation of the first resin layer 44 is disposed in the frame region F, the first resin layer 44 can be disposed up to the outside of the light-emitting region E. Thus, the light-emitting region E can be covered with the first resin layer 44 while the frame region F is caused to be smaller, and thus stress or impact on the light-emitting elements 27 can be alleviated more reliably.

(5) By setting the ratio of the thickness of the thickest portion of the first resin layer 44 to the thickness of the thickest portion 42a of the casing 42 to be equal to or greater than 2:1 and equal to or less than 5:1, the wet-spreading of the second material 43 can be stopped at the thickest portion 42a of the casing 42, while the surface of the second material 43 swells toward the second resin layer 46 on the upper side of the thickest portion 42a of the casing 42, at the time of the formation of the first resin layer 44. Thus, it is possible to more reliably prevent bubbles from being generated between the first resin layer 44 and the second resin layer 46 due to occurrence of a hollow on the surface of the first resin layer 44, and it is possible to prevent the first resin layer 44 from being formed up to the outside beyond the casing 42, while disposing the first resin layer 44 within the range covering the light-emitting elements 27.

(6) The second resin layer 46 is disposed up to the outside of the first resin layer 44 and on the inside of the casing 42. Therefore, when the second resin layer 46 is formed, it is possible to prevent the wet-spreading of the third material 45, while covering the light-emitting elements 27 with the third material 45. Thus, it is possible to limit the frame region F to be small and to efficiently alleviate stress or impact on the light-emitting elements 27.

(7) By setting the ratio of the thickness of the thickest portion of the second resin layer 46 to the thickness of the thickest portion 42a of the casing 42 to be equal to or greater than 1:9 and equal to or less than 3:7, the wet-spreading of the third material 45 can be stopped within the range not exceeding the casing 42, while disposing the third material 45 within the range reaching up to the casing 42, at the time of the formation of the second resin layer 46. Thus, it is possible to prevent the second resin layer 46 from being formed up to the outside beyond the casing 42, while disposing the second resin layer 46 within the range covering the light-emitting elements 27.

(8) Since the light reflection from the interface between the casing 42 and the first resin layer 44 is suppressed, a reduction in the light transmission amount due to the light reflection from the light-emitting region E can be suppressed to be small.

(9) Since the light reflection from the interface between the casing 42 and the second resin layer 46 and the light reflection from the interface between the first resin layer 44 and the second resin layer 46 are suppressed, a reduction in the light transmission amount due to the light reflection from the light-emitting region E can be suppressed to be smaller.

(10) In the organic EL device 1 including the light-emitting elements 27 including the light-emitting functional layer 26 as optical elements, the stress or impact on the light-emitting elements 27 can be alleviated, while narrowing the frame region F other than the light-emitting region E.

(11) The first material 41 is disposed in the casing shape along the outer periphery of the light-emitting region E in which the light-emitting elements 27 are disposed, and the second material 43 is disposed on the inside of the outer peripheral end portion of the first material 41. Therefore, since the excessive wet-spreading of the second material 43 is suppressed by the first material 41 disposed in the casing shape, the frame region F in the first surface 10a can be caused to be small. For example, when the process is performed on the large-scale mother substrate 11 from which the plurality of organic EL devices 1 can be obtained, a variation in the wet-spreading of the second material 43 in the same mother substrate 11 is suppressed by the first material 41 disposed in the casing shape. Further, by hardening the first material 41 and the second material 43 together, it is possible to improve the affinity between the casing 42 and the first resin layer 44 to be formed.

(12) By using a material with high viscosity as the first material 41 forming the casing 42, the wet-spreading of the first material 41 is suppressed. Therefore, the distance between the inner peripheral end portion 42b and the outer peripheral end portion 42c of the casing 42 can be suppressed to be small, and the wet-spreading of the second material 43 can be suppressed by forming the cross-sectional shape of the casing 42 as the convex shape. On the other hand, using a material with low viscosity as the second material 43 forming the first resin layer 44, the second material 43 is satisfactorily wet and spread. Therefore, since the light-emitting elements 27 can be covered with the first resin layer 44, it is possible to smooth the surface of the first resin layer 44 and thus prevent bubbles from being generated.

(13) By using a material with low viscosity as the third material 45 forming the second resin layer 46, the third material 45 is satisfactorily wet and spread. Therefore, since the light-emitting elements 27 can be covered with the second resin layer 46, it is possible to prevent bubbles from being generated between the second resin layer 46 and the first resin layer 44.

(14) Since an epoxy resin which contracts less at the time of the hardening than other resins such as an acrylic resin is used, it is possible to prevent curving, distortion, or the like of the element substrate 10 and the counter substrate 48 caused due to the contraction at the time of the hardening of the first material 41, the second material 43, and the third material 45. Also, by using the same material as the first material 41, the second material 43, and the third material 45, the differences between the related refractive indexes can be caused to be small.

Second Embodiment

Electro-Optic Device

Figure 10:
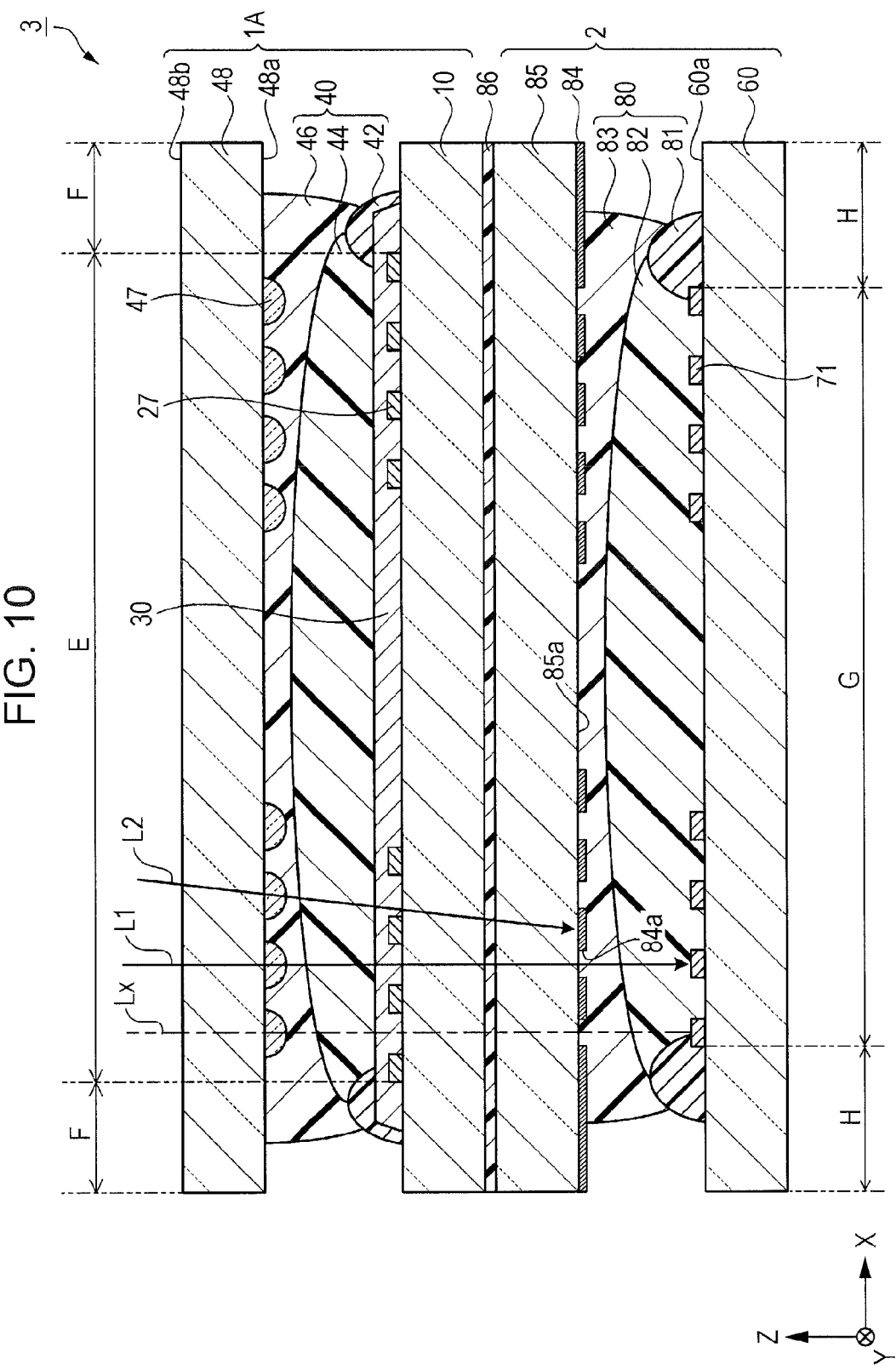
FIG. 10 is a schematic sectional view illustrating the configuration of an organic EL device according to a second embodiment.

Next, a light-receiving and emitting device which is an electro-optic device according to a second embodiment will be described with reference to FIG. 10. FIG. 10 is a schematic sectional view illustrating the configuration of an organic EL device according to the second embodiment. As illustrated in FIG. 10, a light-receiving and emitting device 3 according to the second embodiment is an electro-optic device configured by combining an organic EL device 1A which is an electro-optic device and a light-receiving device 2 which is an electro-optic device.

First, the organic EL device 1A will be described. The organic EL device 1A is disposed on a counter substrate 85 of the light-receiving device 2. The organic EL device 1A is different from the organic EL device 1 according to the first embodiment in that micro-lenses 47 are formed on the surface 48a of the counter substrate 48 and is the same as the organic EL device 1 in the remaining configuration. The same reference numerals are given to common constituent elements with respect to the constituent elements of the organic EL device 1 according to the first embodiment and the description thereof will be omitted.

The micro-lenses 47 are installed on the surface 48a of the counter substrate 48. The micro-lens 47 is a so-called convex lens and has a function of condensing light, such as incident light L1 illustrated in FIG. 10, incident from a surface 48b on the upper side of the counter substrate 48 to a light-receiving element 71 to be described below. The micro-lenses 47 are arrayed in, for example, a matrix form in the light-emitting region E on the surface 48a of the counter substrate 48 to correspond to the light-emitting elements 27. More specifically, each micro-lens 47 is disposed between the mutually adjacent light-emitting elements 27. The micro-lenses 47 arrayed on the surface 48a are generally called a micro-lens array.

The micro-lens 47 is a spherical lens or an aspheric lens formed of a resin, glass, or the like with transmittance. For example, the micro-lenses 47 can be formed by processing the side of the surface 48a of the counter substrate 48 using an area gradation mask method or a multistage exposure method, or the like. A resin material may be disposed on the surface 48a of the counter substrate 48 to form the micro-lenses 47, or the micro-lenses 47 may be formed on another substrate and may be attached to the surface 48a of the counter substrate 48.

The organic EL device 1A is a top emission type device that emits light coming from the light-emitting elements 27 toward the counter substrate 48. The light-emitting elements 27 of the organic EL device 1A emit, for example, near-infrared light rather than color light of red (R), green (G), and blue (B). The organic EL device 1A emits the light toward the counter substrate 48, and causes the micro-lenses 47 to condense the light incident from the counter substrate 48 and causes the light to be incident on the light-receiving device 2. Accordingly, a transmissive material is used in both of the element substrate 10 and the counter substrate 48.

Next, the configuration of the light-receiving device 2 will be described. The light-receiving device 2 is disposed on the side of the element substrate 10 of the organic EL device 1A. The light-receiving device 2 includes an element substrate 60 which is a first substrate, light-receiving elements 71 which are examples of the optical elements installed on a first surface 60a of the element substrate 60, the counter substrate 85 which is a second substrate disposed to interpose the light-receiving elements 71 between the counter substrate 85 and the element substrate 60, and a resin layer 80 which is disposed between the light-receiving elements 71 and the counter substrate 85.

The element substrate 10 of the organic EL device 1A and the counter substrate 85 of the light-receiving device 2 are adhered and fixed via an adhesive layer 86. A resin material with transmittance can be used as the adhesive layer 86 and, for example, the same epoxy resin as the resin layer 40 can be used.

The element substrate 60 and the counter substrate 85 are substrates with an insulation property and are formed of, for example, glass, quartz, a resin, or ceramic. In the light-receiving device 2, a transmissive material is used for the counter substrate 85 since the light condensed by the micro-lenses 47 is incident from the side of the counter substrate 85. The material of the element substrate 60 may be silicon (Si).

The light-receiving device 2 includes a light-receiving region G which is a first region with a substantially rectangular planar shape and a frame region H which is a second region surrounding the periphery of the light-receiving region G on the element substrate 60. The light-receiving region G is a region that practically contributes to light reception in the light-receiving device 2. When the light-receiving and emitting device 3 is used for an apparatus such as a small imaging apparatus, the frame region F of the organic EL device 1A and the frame region H of the light-receiving device 2 are preferably very small (narrow).

In the light-receiving region G on the element substrate 60, the light-receiving elements 71 are arrayed in, for example, a matrix form to correspond to the micro-lenses 47 of the organic EL device 1A (to overlap with the micro-lenses 47 in a plan view). The light-receiving elements 71 include, for example, a photoelectric conversion element (photodiode) using a PIN type semiconductor layer as a photoelectric conversion layer and can detect near-infrared light. The light-receiving element 71 is connected to a circuit unit (not illustrated), and thus a control signal is supplied from an external circuit (not illustrated) to the circuit unit via a connection terminal (not illustrated).

The resin layer 80 has the same configuration as the resin layer 40 of the organic EL device 1A and includes a casing 81, a first resin layer 82, and a second resin layer 83. The resin layer 80 has a function of adhering and fixing the element substrate 60 and the counter substrate 85 and a function of alleviating external stress or impact applied to the light-receiving elements 71 interposed between the element substrate 60 and the counter substrate 85. The light-receiving device 2 may include a protective layer that covers the light-receiving elements 71 between the element substrate 60 and the resin layer 80.

In the resin layer 80 of the light-receiving device 2, the materials, shapes, and thickness of the casing 81, the first resin layer 82, and the second resin layer 83 and positional relations between the casing 81, the first resin layer 82, and the second resin layer 83 and other constituent elements are the same as those of the casing 42, the first resin layer 44, and the second resin layer 46 of the resin layer 40 of the organic EL device 1A.

A light-shielding layer 84 is installed on the surface 85a of the counter substrate 85 on the side facing the element substrate 60. The light-shielding layer 84 is formed as a film with a light-shielding property and is formed of, for example, a metal film such as chromium (Cr). The light-shielding layer 84 is disposed to overlap with the light-emitting elements 27 of the organic EL device 1A in a plan view. In the light-shielding layer 84, openings 84a are formed at the positions corresponding to the light-receiving elements 71 (to overlap with the light-receiving elements 71 in a plan view). The openings 84a are disposed to overlap with the micro-lenses 47 of the organic EL device 1A in a plan view.

An optical axis Lx indicated by a one-dot chain line in FIG. 10 is an imaginary line binding the center of one of the arrayed micro-lenses 47 and the center of the opening 84a and is parallel to the Z-axis direction. The light-receiving element 71 is disposed on the optical axis Lx and the light-emitting element 27 is disposed at a position separated from the optical axis Lx.

The incident light L1 incident on the micro-lens 47 and parallel to the optical axis Lx passes through the opening 84a without shielding of the light by the light-emitting element 27 or the light-shielding layer 84, is incident on the light-receiving element 71, and is received by the light-receiving element 71. On the other hand, incident light L2 incident obliquely with respect to the optical axis Lx is shielded by the light-shielding layer 84. Although not illustrated, incident light incident between the mutually adjacent micro-lenses 47 is shielded by the light-emitting element 27 or the light-shielding layer 84 even when the incident light is parallel to the optical axis Lx.

In the light-receiving and emitting device 3 according to the second embodiment, an irradiated object (not illustrated) can be irradiated with light coming from the organic EL device 1A to the upper side (the side of the counter substrate 48), reflected light reflected from the irradiated object can be condensed by the micro-lenses 47, and an image can be formed on the light-receiving elements 71 of the light-receiving device 2. Thus, for example, image information regarding the irradiated object can be acquired.

According to the second embodiment, in both of the organic EL device 1A and the light-receiving device 2 included in the light-receiving and emitting device 3, it is possible to obtain the same advantages as those of the first embodiment. Since the light-receiving device 2 includes the resin layer 80 having the same configuration as the organic EL device 1A, the frame region H can be suppressed to be smaller, and wet-spreading of the material of the resin layer 80 more than necessary, a variation in the wet-spreading, and generation of bubbles can be prevented. Since reflection from the interfaces between the casing 81, the first resin layer 82, and the second resin layer 83 included in the resin layer 80 is suppressed, a reduction in a light transmission amount can be suppressed to be smaller. Thus, since the light-emitting region E and the light-receiving region G can be set to be larger, light coming from the light-emitting elements 27 can be emitted more brightly. Further, since attenuation of the reflected light incident on the light-receiving elements 71 is suppressed, it is possible to provide the light-receiving and emitting device 3 capable of acquiring image information with higher precision.

Since the light-receiving elements 71 or the light-shielding layer 84 in the light-receiving device 2 can be formed using known technologies and the resin layer 80 can be formed according to the same method and conditions as those of the resin layer 40 of the organic EL device 1A, the description of a method of manufacturing the light-receiving device 2 will be omitted.

Third Embodiment

Electronic Apparatus

Figure 11:
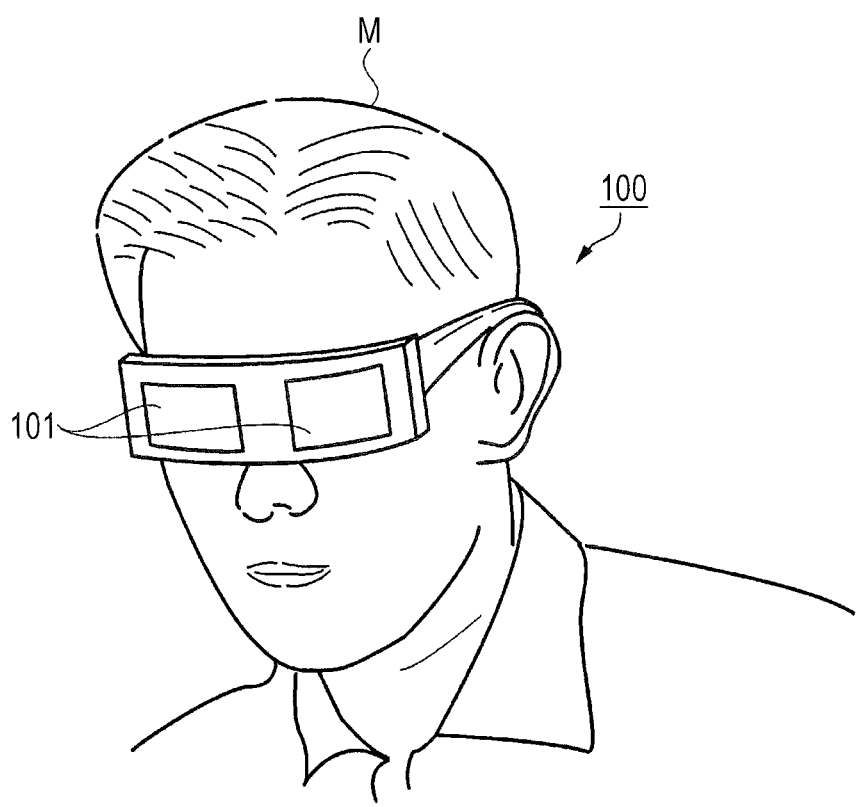
FIG. 11 is a schematic diagram illustrating the configuration of a head-mounted display which is an electronic apparatus according to a third embodiment.

Next, an electronic apparatus according to a third embodiment will be described with reference to FIG. 11. FIG. 11 is a schematic diagram illustrating the configuration of a head-mounted display which is an electronic apparatus according to a third embodiment.

As illustrated in FIG. 11, a head-mounted display (HMD) 100 according to the third embodiment includes two display units 101 installed to correspond to left and right eyes. A viewer M can view text, images, or the like displayed on the display units 101 when the viewer M mounts the head-mounted display 100 on his or her head part like glasses. For example, when images in consideration of parallax are displayed on the left and right display units 101, the viewer M can view and enjoy a stereoscopic image.

The organic EL device 1 according to the first embodiment is mounted on each display unit 101. Accordingly, it is possible to provide the head-mounted display 100 that has excellent display quality without display irregularity and is small and lightweight.

The head-mounted display 100 is not limited to the configuration in which the two display units 101 are provided, and may have a configuration in which one display unit 101 corresponding to one of the left and right is provided.

An electronic apparatus on which the organic EL device 1 according to the first embodiment is mounted is not limited to the head-mounted display 100. Examples of the electronic apparatus on which the organic EL device 1 is mounted include a personal computer, a portable information terminal, a navigator, a viewer, and an electronic apparatus including a display such as a head-up display.

Fourth Embodiment

Electronic Apparatus

Figure 12:
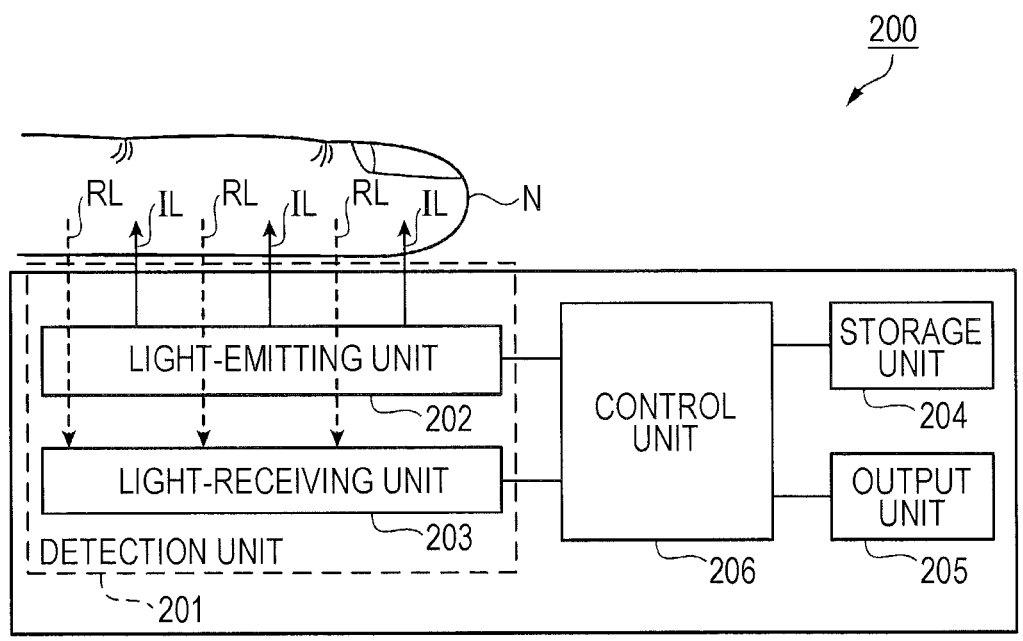
FIG. 12 is a schematic diagram illustrating the configuration of an inspection apparatus which is an electronic apparatus according to a fourth embodiment.

Next, an electronic apparatus according to a fourth embodiment will be described with reference to FIG. 12. FIG. 12 is a schematic diagram illustrating the configuration of an inspection apparatus which is an electronic apparatus according to a fourth embodiment. An inspection apparatus 200 according to the fourth embodiment is a biometric authentication apparatus that images a vein image of a finger N and performs personal authentication.

As illustrated in FIG. 12, the inspection apparatus 200 according to the fourth embodiment includes a detection unit 201, a storage unit 204, an output unit 205, and a control unit 206. The light-receiving and emitting device 3 according to the second embodiment is mounted as the detection unit 201 on the inspection apparatus 200. The detection unit 201 includes the organic EL device 1A serving as a light-emitting unit 202 and the light-receiving device 2 serving as a light-receiving unit 203.

The storage unit 204 includes a flash memory or a non-volatile memory such as a hard disk. The output unit 205 includes, for example, a display unit and an audio reporting unit. The control unit 206 includes a CPU (Central Processing Unit) and a RAM (Random Access Memory) and controls lighting or extinguishing of the light-emitting unit 202. The control unit 206 also reads a light-receiving signal from the light-receiving unit 203.

In the inspection apparatus 200, the finger N is irradiated with radiation light IL from the light-emitting unit 202 and reflected light RL from the finger N is detected by the light-receiving unit 203. The radiation light IL emitted from the light-emitting unit 202 (the light-emitting elements 27 illustrated in FIG. 10) is near-infrared light and its wavelength is, for example, about 750 nm to about 3000 nm. When the radiation light IL reaches the inside of the finger N, the radiation light IL is scattered and a part of the scattered radiation light IL is reflected as the reflected light RL toward the light-receiving unit 203 (the light-receiving elements 71 illustrated in FIG. 10).

The light-receiving elements 71 of the light-receiving unit 203 detect the near-infrared light. Reduced hemoglobin flowing in a vein has a property of absorbing the near-infrared light. Therefore, when the finger N is irradiated with the near-infrared light from the light-emitting unit 202, the near-infrared light is reflected from a portion other than the vein. Therefore, when the near-infrared light reflected from the finger N is detected by the light-receiving unit 203 and an image of the finger N is acquired, a vein portion under the skin of the finger N is shown more darkly than peripheral tissues in the acquired image. A pattern formed by a difference in the brightness is the vein image. The reflected light RL from the finger N is converted into an electric signal (light-receiving signal) having a signal level according to the amount of light by the light-receiving unit 203.

The storage unit 204 stores a vein image (for example, the index finger of the right hand) of the finger N registered in advance as a master vein image for personal authentication. The control unit 206 reads the light-receiving signal from the light-receiving unit 203 and generates the vein image of the finger N based on the read light-receiving signal corresponding to one frame (corresponding to an imaged region). Then, the control unit 206 performs the personal authentication by checking the generated vein image and the master vein image registered in the storage unit 204.

The output unit 205 reports an authentication result by display or audio. In this way, the inspection apparatus 200 can image the vein image of the finger N with high precision and perform the personal authentication. A biological part which is a vein authentication target is not limited to the finger N, but may be a palm, the back of a hand, an eye, or the like.

Since the light-receiving and emitting device 3 is mounted as the detection unit 201 on the inspection apparatus 200, it is possible to provide the inspection apparatus 200 that has an excellent detection accuracy and is small and lightweight.

An electronic apparatus on which the light-receiving and emitting device 3 according to the second embodiment is mounted is not limited to the inspection apparatus 200. Examples of the electronic apparatus on which the light-receiving and emitting device 3 is mounted include electronic apparatuses such as a small biosensor, a pulsimeter, a pulse oximeter, a blood sugar-level analyzer, a fruit sugar content analyzer that can be normally applied in medical and health fields. Further, examples of the electronic apparatus on which the light-receiving and emitting device 3 is mounted include electronic apparatuses such as a personal computer or a mobile phone having a biometric authentication function.

The above-described embodiments are merely aspects of the invention and can be modified and applied in any way within the scope of the invention. For example, the following modification examples can be considered.

Modification Example 1

The organic EL device 1 according to the first embodiment has the configuration in which the element substrate 10 and the counter substrate 48 are adhered and fixed by the resin layer 40, but the invention is not limited to the configuration. For example, when a space in which a sealing member is disposed is present in the frame region F, the element substrate 10 and the counter substrate 48 may be fixed together with the resin layer 40 by the sealing member.

Figure 13:
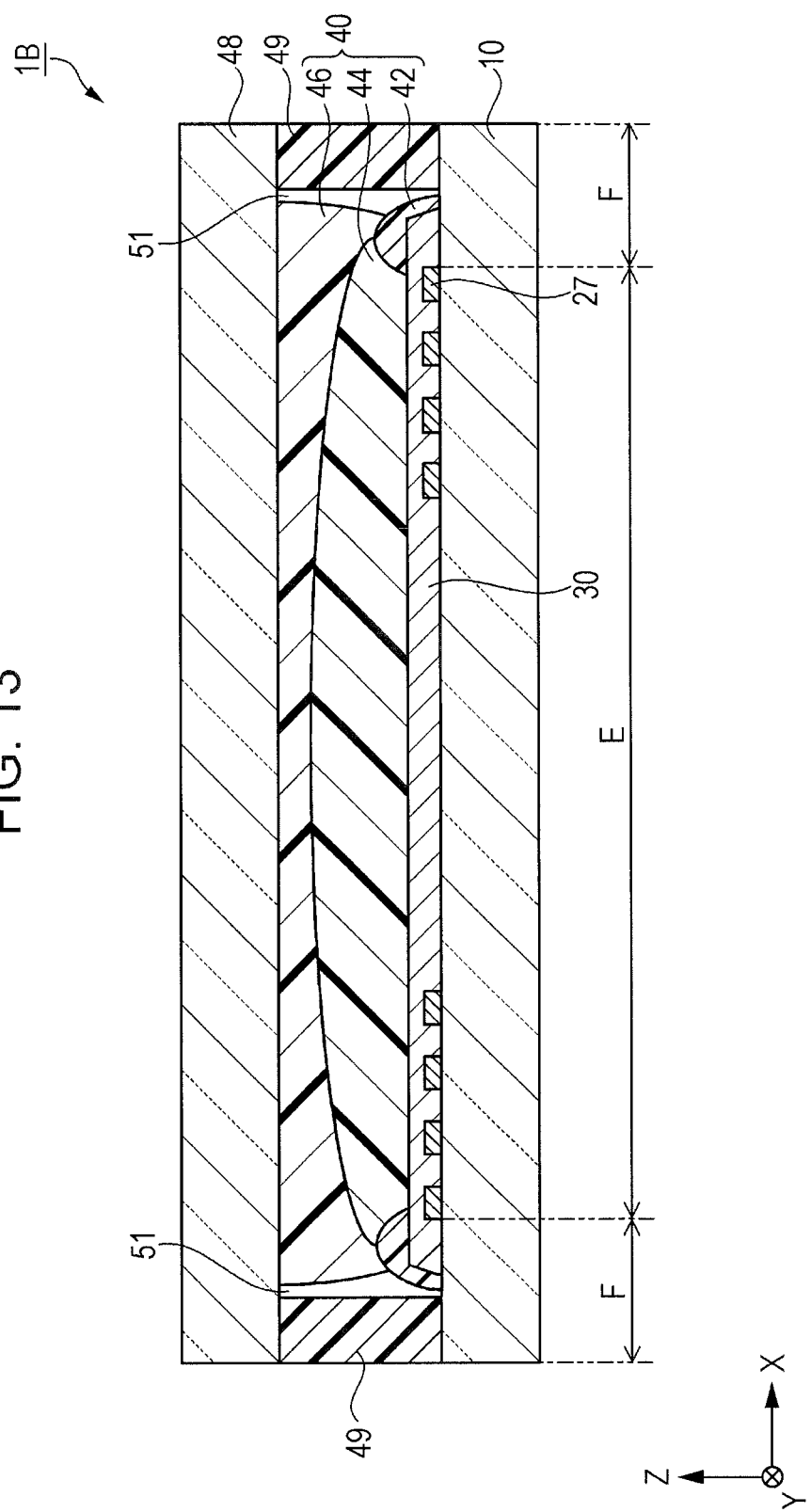
FIG. 13 is a schematic sectional view illustrating the configuration of an organic EL device according to Modification Example 1.

FIG. 13 is a schematic sectional view illustrating the configuration of an organic EL device according to Modification Example 1. As illustrated in FIG. 13, an organic EL device 1B according to Modification Example 1 is different from the organic EL device 1 according to the first embodiment in that a sealing member 49 is further included, and the remaining configuration is almost the same. The same reference numerals are given to common constituent elements with respect to those of the organic EL device 1 according to the first embodiment and the description thereof will be omitted.

The sealing member 49 is installed between the element substrate 10 and the counter substrate 48. In the frame region F, the sealing member 49 is disposed in a casing shape to surround the periphery of the resin layer 40 in a plan view. A void 51 is formed between the sealing member 49 and the resin layer 40.

For example, the sealing member 49 is formed of an epoxy resin with the same high viscosity as the first material 41 forming the casing 42 and includes a gap member (not illustrated). Since the sealing member 49 includes the gap member, the space between the element substrate 10 and the counter substrate 48 can be held at a predetermined interval (for example, 100 µm) with higher precision. The sealing member 49 and the resin layer 40 can satisfactorily alleviate external stress or impact applied to the light-emitting elements 27.

The void 51 formed between the sealing member 49 and the resin layer 40 serves to suppress wet-spreading of a resin material (third material 45) and suppress protrusion of the sealing member 49 to the outside in the process of forming the resin layer 40 (second resin layer 46).

The process of forming the sealing member 49 is performed between the process of forming the first resin layer 44 and the process of forming the second resin layer 46. After the casing 42 and the first resin layer 44 are formed on the element substrate 10, a resin material forming the sealing member 49 is applied to the periphery of the casing 42 by a dispenser (not illustrated) or the like. Thereafter, the third material 45 is applied to the first resin layer 44. Here, even when the third material 45 is wet and spread to the outside of the outer peripheral end portion 42c (see FIG. 4) of the casing 42, the wet and spread third material 45 can remain within the void 51 and thus can be prevented from protruding to the outside of the sealing member 49. Thereafter, the counter substrate 48 is disposed on the resin material forming the sealing member 49 and the third material 45 and both of these materials are hardened together.

In the configuration of the organic EL device 1B according to the foregoing Modification Example 1, the wet-spreading of the materials (the first material 41, the second material 43, and the third material 45) of the resin layer 40 are prevented, as in the first embodiment. Thus, since the void 51 can be set to be smaller compared to a configuration in which a sealing member of the related art is included, the frame region F can be set to be small, and thus it is possible to prevent the materials of the resin layer 40 from protruding to the outside of the sealing member 49. Further, by using an epoxy resin with a small degree of contraction at the time of the hardening as the materials of the sealing member 49 and the resin layer 40, it is possible to prevent curving and distortion of the element substrate 10 and the counter substrate 48 due to non-uniformity of the thickness of the formed sealing member 49 and the thickness of the formed resin layer 40.

Modification Example 2

The organic EL device 1 according to the first embodiment has the configuration in which the casing 42 is formed to cover the outer peripheral end portion of the sealing layer 30, but the invention is not limited to this configuration. The outer peripheral end portion of the sealing layer 30 may be disposed on the outside of the casing 42.

Figure 14:
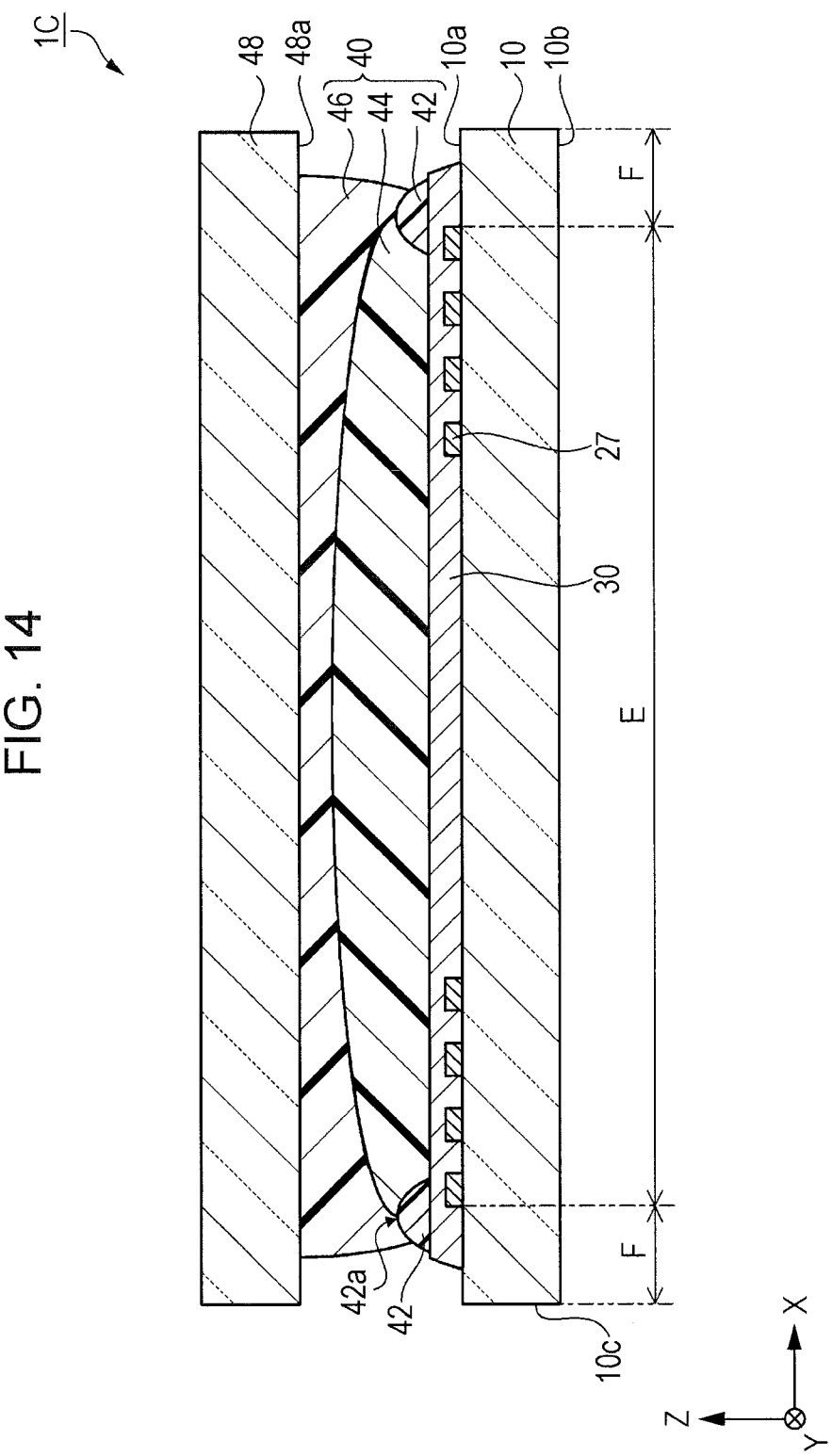
FIG. 14 is a schematic sectional view illustrating the configuration of an organic EL device according to Modification Example 2.

FIG. 14 is a schematic sectional view illustrating the configuration of an organic EL device according to Modification Example 2. As illustrated in FIG. 14, in an organic EL device 1C according to Modification Example 2, the casing 42 is formed on the inside of the outer peripheral end portion of the sealing layer 30 and the sealing layer 30 is not covered with the casing 42, unlike the organic EL device 1 according to the first embodiment. In this configuration, the frame region F can be set to be smaller than the frame region of the first embodiment.

Modification Example 3

In the foregoing embodiments, Modification Example 1, and Modification Example 2, the light-emitting device, the light-receiving device, and the light-emitting and receiving device combining the light-emitting device and the light-receiving device have been exemplified as the electro-optic devices in the foregoing description, but the invention is not limited thereto. The invention is also applicable to other electro-optic devices such as an electrophoretic device in which electrophoretic elements are disposed on a substrate.

The entire disclosure of Japanese Patent Application No. 2013-101931, filed May 14, 2013 is expressly incorporated by reference herein.

What is claimed is:

1. An electro-optic device comprising:
   a first substrate that includes a first surface;
   an optical element that is disposed in a first region on the first surface;
   a sealing layer covering the optical element;
   a casing that is disposed to overlap with a part of the optical element along an outer periphery of the first region on the first surface and includes first and second end portions;
   a first resin layer that is disposed on an inside of the second end portion of the casing on the first surface and is installed to overlap with at least a part of the optical element;
   a second resin layer that is disposed on the first resin layer;
   an outer peripheral end of the second resin layer that is disposed between an outer peripheral end of the first resin layer and the second end portion of the casing; and
   a second substrate that faces the first surface and is disposed on the second resin layer,
   wherein the casing and first resin layer are directly disposed on a surface of the sealing layer and cover substantially all of the sealing layer in the first region, and
   the casing does not contact the second substrate.

2. The electro-optic device according to claim 1,
   wherein a film thickness of the first resin layer becomes gradually thicker with further separation from the casing, and
   a thickness of a thickest portion in the film thickness of the first resin layer is thicker than a thickness of a thickest portion in a film thickness of the casing.

3. The electro-optic device according to claim 1,
   wherein the second end portion of the casing is disposed in a second region surrounding the first region, and
   the first resin layer is disposed to embed an inside of the first end portion of the casing and contacts the casing at a point which is closer to the second end portion than the first end portion.

4. The electro-optic device according to claim 1,
   wherein the first end portion of the casing is disposed in the first region, and
   a thickest portion in a film thickness of the casing is disposed in a second region surrounding the first region.

5. The electro-optic device according to claim 1, wherein a ratio of a thickness of a thickest portion in a film thickness of the first resin layer to a thickness of a thickest portion in a film thickness of the casing is equal to or greater than 2:1 and is equal to or less than 5:1.

6. The electro-optic device according to claim 1, wherein a ratio of a thickness of a thinnest portion in a film thickness of the second resin layer to a thickness of a thickest portion in a film thickness of the first resin layer is equal to or greater than 1:9 and is equal to or less than 3:7.

7. The electro-optic device according to claim 1, wherein a difference between a refractive index of the casing and a refractive index of the first resin layer is equal to or less than 0.05.

8. The electro-optic device according to claim 1, wherein a difference between a refractive index of the casing and a refractive index of the second resin layer and a difference between a refractive index of the first resin layer and the refractive index of the second resin layer is equal to or less than 0.05.

9. The electro-optic device according to claim 1, wherein the optical element includes an organic light-emitting layer.

10. An electronic apparatus comprising:
the electro-optic device according to claim 1.

11. An electronic apparatus comprising:
the electro-optic device according to claim 2.

12. An electronic apparatus comprising:
the electro-optic device according to claim 3.

13. An electronic apparatus comprising:
the electro-optic device according to claim 4.

14. An electronic apparatus comprising:
the electro-optic device according to claim 5.

15. An electronic apparatus comprising:
the electro-optic device according to claim 6.

16. An electro-optic device comprising:
a first substrate;
a second substrate opposite to the first substrate;
an optical element that is disposed above the first substrate;
a sealing layer that covers the optical element;
a casing that contacts and covers an edge of the sealing layer; a first resin layer that contacts and is disposed on a surface of the sealing layer and the casing; and a second resin layer that contacts and is disposed on the casing and the first resin layer,
wherein the second substrate is disposed on the second resin layer and does not contact the casing.

17. The electro-optic device according to claim 16,
wherein the casing has a first casing and a second casing, and
the first resin layer is disposed in a region positioned between the first casing and the second casing.

18. An electronic apparatus comprising:
the electro-optic device according to claim 16.

19. An electronic apparatus comprising:
the electro-optic device according to claim 17.

20. An electro-optic device comprising: a first substrate;
a second substrate opposite to the first substrate;
an optical element that is disposed above the first substrate;
a sealing layer that covers the optical element;
a casing that contacts and covers an edge of the sealing layer and includes first and second end portions;
a first resin layer that contacts and is disposed on a surface of the sealing layer and the casing;
a second resin layer that is disposed on the casing and the first resin layer; and
an outer peripheral end of the second resin layer that is disposed between an outer peripheral end of the first resin layer and the second end portion of the casing,
wherein the second substrate is disposed on the second resin layer and does not contact the casing.

* * * * *